(12) United States Patent
Ryu et al.

(10) Patent No.: US 9,735,341 B2
(45) Date of Patent: Aug. 15, 2017

(54) SINGLE-CRYSTAL PIEZOELECTRIC FIBER COMPOSITE AND MAGNETOELECTRIC LAMINATE COMPOSITE INCLUDING THE SAME

(71) Applicant: Korea Institute of Machinery and Minerals, Daejeon (KR)

(72) Inventors: Jungho Ryu, Gyeongsangnam-do (KR); Dong-Soo Park, Gyeongsangnam-do (KR); Woon-Ha Yoon, Gyeongsangnam-do (KR)

(73) Assignee: KOREA INSTITUTE OF MACHINERY AND MATERIALS, Daejeon (KR)

( * ) Notice: Subject to any disclaimer, the term of this patent is extended or adjusted under 35 U.S.C. 154(b) by 296 days.

(21) Appl. No.: 14/602,710

(22) Filed: Jan. 22, 2015

(65) Prior Publication Data

US 2015/0236242 A1    Aug. 20, 2015

(30) Foreign Application Priority Data

Jan. 28, 2014 (KR) ........................ 10-2014-0010569

(51) Int. Cl.
| | |
|---|---|
| *H01L 41/187* | (2006.01) |
| *H01L 41/12* | (2006.01) |
| *H01L 41/08* | (2006.01) |
| *H01L 41/083* | (2006.01) |
| *H01L 41/047* | (2006.01) |

(Continued)

(52) U.S. Cl.
CPC ............ *H01L 41/125* (2013.01); *B32B 37/18* (2013.01); *B32B 38/0004* (2013.01); *H01L 41/047* (2013.01); *H01L 41/0533* (2013.01); *H01L 41/082* (2013.01); *H01L 41/083* (2013.01);

(Continued)

(58) Field of Classification Search
CPC . H01L 41/125; H01L 41/047; H01L 41/0533; H01L 41/082; H01L 41/083; B32B 37/18; B32B 38/0004
See application file for complete search history.

(56) References Cited

FOREIGN PATENT DOCUMENTS

| KR | 10-2010-0033824 A | 3/2010 |
|---|---|---|
| KR | 10-2012-0122402 A | 7/2012 |

(Continued)

*Primary Examiner* — Thomas Dougherty
(74) *Attorney, Agent, or Firm* — Dentons US LLP

(57) ABSTRACT

A piezoelectric fiber composite and a magnetoelectric laminate composite including the same are disclosed. The piezoelectric fiber composite includes a first protective layer having a first electrode, a second protective layer having a second electrode, and a piezoelectric fiber layer formed between the first and the second electrode and having piezoelectric fibers arranged in the longitudinal direction of the composite, wherein the piezoelectric fibers include a single-crystal piezoelectric material and are configured such that a <011> direction of the single crystal is identical to a thickness direction of the composite and a <001> direction of the single crystal is identical to a longitudinal direction of the composite, thus exhibiting superior piezoelectric strain properties and sensing properties. Also, the magnetoelectric laminate composite includes the piezoelectric fiber composite and a magnetostrictive layer including a magnetostrictive material such as nickel (Ni) or Metglas (FeBSi alloy), thus ensuring significantly improved magnetoelectric properties.

13 Claims, 28 Drawing Sheets

(51) Int. Cl.
*H01L 41/053* (2006.01)
*B32B 37/18* (2006.01)
*B32B 38/00* (2006.01)

(52) U.S. Cl.
CPC ....... *B32B 2307/20* (2013.01); *B32B 2457/00* (2013.01); *Y10T 156/1052* (2015.01)

(56) References Cited

FOREIGN PATENT DOCUMENTS

| | | | |
|---|---|---|---|
| KR | 10-1305271 B1 | 9/2013 | |
| KR | 10-2013-0123807 A | 11/2013 | |
| KR | EP-2899765 A1 * | 7/2015 | ............. H01L 41/08 |
| WO | WO/01/33648 A1 | 5/2001 | |

* cited by examiner

SINGLE-CRYSTAL PIEZOELECTRIC FIBER COMPOSITE AND MAGNETOELECTRIC LAMINATE COMPOSITE INCLUDING THE SAME

CROSS-REFERENCE TO RELATED APPLICATION

This application claims priority to Korean Patent Application No. 10-2014-0010569 filed on Jan. 28, 2014 and all the benefits accruing therefrom under 35 U.S.C. §119, the contents of which are incorporated by reference in their entirety.

BACKGROUND OF THE INVENTION

1. Field of the Invention

The present invention relates to a piezoelectric fiber composite, a preparation method thereof, a magnetoelectric laminate composite including the piezoelectric fiber composite, a manufacturing method thereof and a piezoelectric device including the piezoelectric fiber composite or the magnetoelectric laminate composite. More particularly, the present invention relates to a single-crystal piezoelectric fiber composite containing single-crystal piezoelectric fibers oriented in a specific direction, a preparation method thereof, a magnetoelectric laminate composite including the piezoelectric fiber composite, a manufacturing method thereof, and a piezoelectric device including the piezoelectric fiber composite or the magnetoelectric laminate composite.

2. Description of the Related Art

Piezoelectric materials are being widely utilized in sensors, actuators, energy harvesting devices, ultrasonic instruments, etc. using piezoelectric effects for converting external stress into an electric signal or an electric input into a mechanical output.

However, most piezoelectric materials are ceramic materials, and thus limitations are imposed on application into various shapes and usages thereof due to the intrinsic brittleness of ceramic materials.

Hence, research is ongoing into composites configured such that piezoelectric ceramic fibers are included in a flexible matrix made of a polymer material, and a typical example of such a composite includes a macro fiber composite (MFC) [Patent Document 0001]. Also, an actuator formed using MFC is known [Patent Document 0002].

However, since a piezoelectric fiber composite such as MFC includes the polymer matrix between electrodes and piezoelectric fibers, it is difficult to predict and design the control and operation of devices; furthermore, high driving voltage is required to operate the device including such a composite, which is very undesirable.

Moreover, a piezoelectric fiber composite such as MFC is problematic because it is impossible to maximize piezoelectric properties that vary depending on the crystal orientation of the piezoelectric material, due to the use of ceramic piezoelectric fiber materials.

Accordingly, there is need for composites useful in fabrication of energy harvesting devices as well as sensors or actuators by solving the aforementioned problems while keeping the known advantages of the piezoelectric fiber composite.

CITATION LIST

Patent Literature (Patent Document 0001) International Publication No. WO 01/33648 A1

(Patent Document 0002) Korean Patent Application Publication No. 10-2010-0033824

SUMMARY OF THE INVENTION

Accordingly, the present invention has been made keeping in mind the above problems encountered in the related art, and an object of the present invention is to provide a piezoelectric fiber composite and a preparation method thereof, wherein the piezoelectric fiber composite includes piezoelectric fibers composed of a single crystal having a specific crystallographic direction oriented in a poling direction to maximize piezoelectric effects; and a magnetoelectric laminate composite and a manufacturing method thereof, wherein the magnetoelectric laminate composite includes the piezoelectric fiber composite as above and a magnetostrictive layer formed of a magnetostrictive material on one or both sides of the piezoelectric fiber composite to achieve greatly improved magnetoelectric effects due to interactions with the composite.

In order to accomplish the above object, the present invention provides a piezoelectric fiber composite, comprising: a first protective layer including a first electrode formed on one side thereof; a second protective layer including a second electrode formed on one side thereof; and a piezoelectric fiber layer interposed between the first electrode and the second electrode and composed of one or more piezoelectric fibers arranged in a longitudinal direction of the composite, wherein the piezoelectric fibers comprise a single-crystal piezoelectric material and are configured such that a <011> direction of a single crystal is identical to a thickness direction of the composite and a <001> direction of the single crystal is identical to a longitudinal direction of the composite.

In addition, the present invention provides a method of preparing a piezoelectric fiber composite, comprising: (a) bonding, on a first electrode formed on one side of a first protective layer, a piezoelectric single-crystal layer composed of a single-crystal piezoelectric material and configured such that a <011> direction of a single crystal is identical to a thickness direction of the composite and a <001> direction of the single crystal is identical to a longitudinal direction of the composite; (b) cutting the piezoelectric single-crystal layer in a longitudinal direction, thus forming a piezoelectric fiber layer comprising one or more piezoelectric fibers; and (c) bonding a second protective layer on the piezoelectric fiber layer so as to bring a second electrode formed on one side of the second protective layer into contact with the piezoelectric fiber layer.

In addition, the present invention provides a magnetoelectric laminate composite, comprising: a piezoelectric fiber composite; and a magnetostrictive layer formed of a magnetostrictive material on one or both sides of the composite, wherein the piezoelectric fiber composite includes piezoelectric fibers composed of a single-crystal piezoelectric material and configured such that a <011> direction of a single crystal is identical to a thickness direction of the composite and a <001> direction of the single crystal is identical to a longitudinal direction of the composite.

In addition, the present invention provides a method of manufacturing a magnetoelectric laminate composite, comprising: (a) preparing a magnetostrictive layer composed of a magnetostrictive material; (b) preparing a piezoelectric fiber composite including piezoelectric fibers composed of a single-crystal piezoelectric material and configured such that a <011> direction of a single crystal is identical to a thickness direction of the composite and a <001> direction of the single crystal is identical to a longitudinal direction of the composite; and (c) laminating the magnetostrictive layer on one or both sides of the piezoelectric fiber composite.

In addition, the present invention provides a piezoelectric device, comprising the piezoelectric fiber composite or the magnetoelectric laminate composite.

According to the present invention, a piezoelectric fiber composite includes piezoelectric fibers composed of a single-crystal piezoelectric material and arranged so that the <011> direction of the single crystal is identical to the thickness direction of the composite and the <001> direction of the single crystal is identical to the longitudinal direction of the composite, thus exhibiting superior piezoelectric strain properties and sensing properties depending on a specific orientation direction of the piezoelectric single crystal. In particular, upon operation in 32 mode at which a poling direction and a strain direction are perpendicular to each other, the composite of the invention can manifest remarkably improved piezoelectric properties, and thereby can be useful in not only sensors and actuators but also energy harvesting devices for mechanical vibration energy due to high mechanical stability.

Also, according to the present invention, a magnetoelectric laminate composite is configured such that a magnetostrictive layer composed of a magnetostrictive material such as nickel (Ni) or Metglas (FeBSi alloy) is provided on one or both sides of the piezoelectric fiber composite having the properties as above, thus ensuring significantly improved magnetoelectric properties compared to existing magnetoelectric laminate composites. Furthermore, this laminate can show excellent performance in energy harvesting devices in response to external stimulation including changes in mechanical vibration and/or magnetic field.

In particular, when the magnetoelectric laminate composite according to the present invention is used as an energy harvesting device for power-line monitoring sensor driving power source, power is supplied to the sensor via energy harvesting for producing power from a parasitic magnetic field around the power-line and/or mechanical vibration energy around the power-line. Thereby, as power can be continuously and stably supplied without the need for periodic replacement of a power supply, a sensor node can be operated semi-permanently, and simultaneously the lifecycle of the sensor node and the reliability of data to be sensed can be increased, ultimately accelerating the commercialization of USN-based systems such as power-line remote monitoring systems.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PRESENTLY PREFERRED EMBODIMENTS

Hereinafter, a detailed will be given of the present invention.

According to the present invention, a piezoelectric fiber composite includes protective layers, electrodes, and a piezoelectric fiber layer, in which piezoelectric fibers comprise a single-crystal piezoelectric material and are configured such that the <011> direction of the single crystal is identical to the thickness direction of the composite.

Furthermore, the longitudinal direction of the piezoelectric fibers may be identical to the <001> direction of the single crystal, and thereby the piezoelectric fiber composite may operate in 32 mode in which a poling direction and a strain direction are perpendicular to each other, thus exhibiting further improved piezoelectric properties.

For reference, in the present invention, the piezoelectric fiber composite refers to a composite having a structure in which one or more piezoelectric fibers composed of a piezoelectric material and arranged in a predetermined direction are enclosed with a polymer matrix so as to be protected, or in which a piezoelectric fiber layer comprising one or more piezoelectric fibers arranged in a predetermined direction is interposed between protective layers made of a polymer.

Such a piezoelectric fiber composite is advantageous because it may operate even when the piezoelectric fibers are damaged due to mechanical or electrical causes. This advantage may be more significant in proportion to an increase in the number of piezoelectric fibers contained in the piezoelectric fiber composite. Whereas, as the number of piezoelectric fibers contained in the piezoelectric fiber composite decreases, the effective area of the piezoelectric fiber layer is enlarged and thus force or output power may be further increased.

Figure 1:
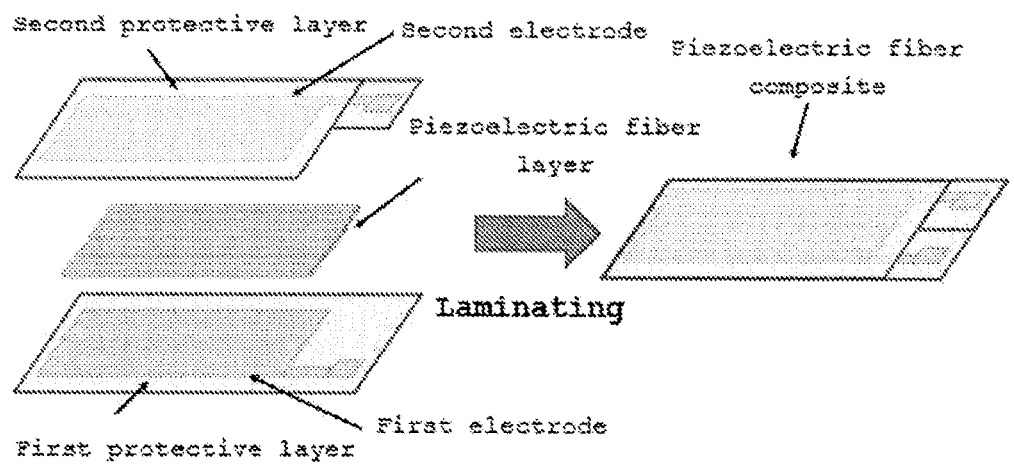
FIG. 1 schematically illustrates a piezoelectric fiber composite according to an embodiment of the present invention.

As illustrated in FIG. 1, the piezoelectric fiber composite according to the present invention includes: a first protective layer having a first electrode formed on one side thereof; a second protective layer having a second electrode formed on one side thereof; and a piezoelectric fiber layer interposed between the first electrode and the second electrode and composed of one or more piezoelectric fibers arranged in a longitudinal direction of the composite. As such, the piezoelectric fibers comprise a single-crystal piezoelectric material and are configured such that the <011> direction of the single crystal is identical to the thickness direction of the composite and the <001> direction of the single crystal is identical to the longitudinal direction of the composite.

The single-crystal piezoelectric material of the piezoelectric fibers contained in the piezoelectric fiber composite may have a perovskite crystal structure ($NO_3$)R or a complex perovskite structure.

The single crystal having a complex perovskite structure may have a composition of 1) or 2) below:

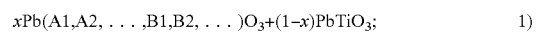

$$xPb(A1,A2,\ldots,B1,B2,\ldots)O_3+(1-x)PbTiO_3; \qquad 1)$$

and

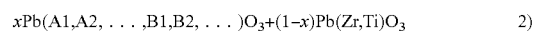

$$xPb(A1,A2,\ldots,B1,B2,\ldots)O_3+(1-x)Pb(Zr,Ti)O_3 \qquad 2)$$

(wherein x is a molar fraction, 0<x<1, A1, A2, . . . are at least one element selected from the group consisting of Zn, Mg, Ni, Lu, In and Sc, and B1, B2, . . . are at least one element selected from the group consisting of Nb, Ta, Mo and W).

Typical examples of the single-crystal piezoelectric material having a complex perovskite structure may include Pb($Mg_{1/3}Nb_{2/3}$)$O_3$—$PbTiO_3$ (PMN—PT), Pb($Mg_{1/3}Nb_{2/3}$)$O_3$—Pb(Zr, Ti)$O_3$ (PMN—PZT), and Pb($Zn_{1/3}Nb_{2/3}$)$O_3$—$PbTiO_3$ (PZN—PT).

More preferably, examples of the single crystal having a complex perovskite crystal structure include rhombohedral relaxor ferroelectrics such as xPb($Mg_{1/3}Nb_{2/3}$)$O_3$-(1-x)$PbTiO_3$ (0<x<0.33) and xPb($Zn_{1/3}Nb_{2/3}$)$O_3$-(1-x)$PbTiO_3$ (0<x<0.08). As for the formation of the piezoelectric fibers using rhombohedral relaxor ferroelectrics, when the crystal direction of the single crystal is oriented so that the <011> direction of the single crystal is parallel to the thickness direction of the piezoelectric fiber composite, high transverse piezoelectric strain constant and electromechanical coupling factor may be obtained compared to when a single crystal is oriented in a <001> direction. Accordingly, when a piezoelectric device is manufactured in a mode (31 mode or 32 mode) having a poling direction and a strain direction perpendicular to each other, piezoelectric effects for converting external stress such as force, impact and vibration into an electrical signal or an electrical input into a mechanical output may become maximum.

Figure 2:
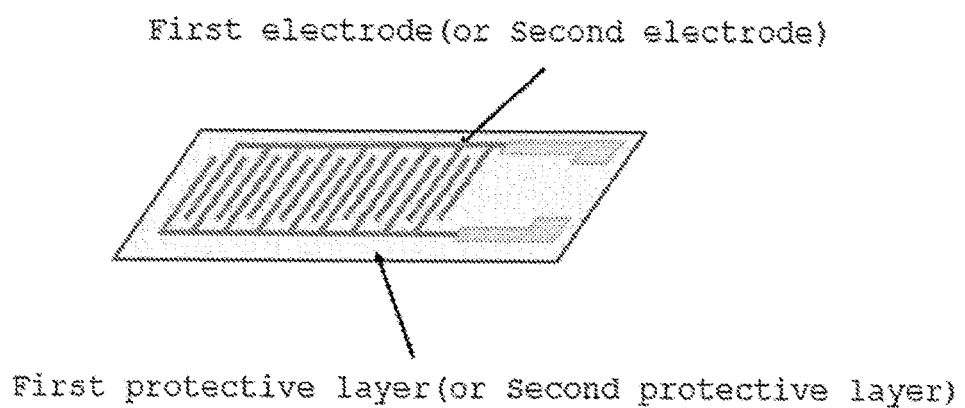
FIG. 2 schematically illustrates the shape of an electrode of the piezoelectric fiber composite according to an embodiment of the present invention.

The first and the second electrode may be made of any known electrode material such as copper (Cu), silver (Ag), gold (Au), aluminum (Al) and so on, and may be provided in the form of a full-area electrode as in the first and the second electrode of the piezoelectric fiber composite as illustrated in FIG. 1, or may be provided in the form of an interdigitated electrode (IDE) as illustrated in FIG. 2 able to exhibit superior piezoelectric and magnetoelectric properties as in the full-area electrode.

The first and the second protective layer are preferably made of a polymer material, which is exemplified by polyimide (PI), polyethylene naphthalate (PEN), polyethylene terephthalate (PET) or polycarbonate (PC).

According to the present invention, the piezoelectric fiber composite may be formed by (a) bonding, on the first electrode formed on one side of a first protective layer, a piezoelectric single-crystal layer composed of a single-crystal piezoelectric material and configured such that the <011> direction of the single crystal is identical to the thickness direction of the composite and the <001> direction of the single crystal is identical to the longitudinal direction of the composite; (b) cutting the piezoelectric single-crystal layer in a longitudinal direction, thus forming a piezoelectric fiber layer comprising one or more piezoelectric fibers; (c) bonding a second protective layer on the piezoelectric fiber layer so as to bring the second electrode formed on one side of the second protective layer into contact with the piezoelectric fiber layer; and (d) subjecting the piezoelectric fibers to poling.

However, the method of preparing the piezoelectric fiber composite according to the present invention is not limited to the foregoing. In addition to the method as above, the piezoelectric fiber layer may be formed by cutting the piezoelectric single-crystal layer before being bonded to the protective layer to thereby bond individual piezoelectric fibers to the protective layer, or alternatively by bonding single-crystal fibers obtained by extrusion/single crystal growth, to the protective layer.

Below is a description of a magnetoelectric laminate composite according to the present invention.

Figure 3A:
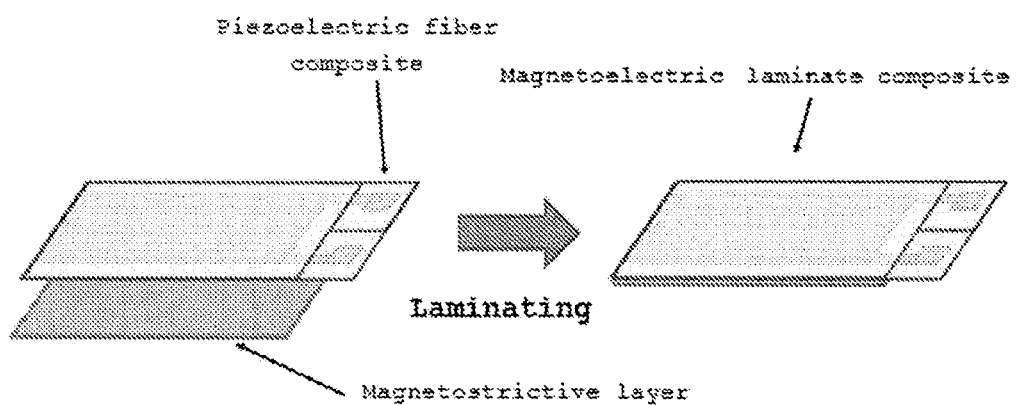
FIG. 3A schematically illustrate a magnetoelectric laminate composite according to an embodiment of the present invention.
Figure 3B:
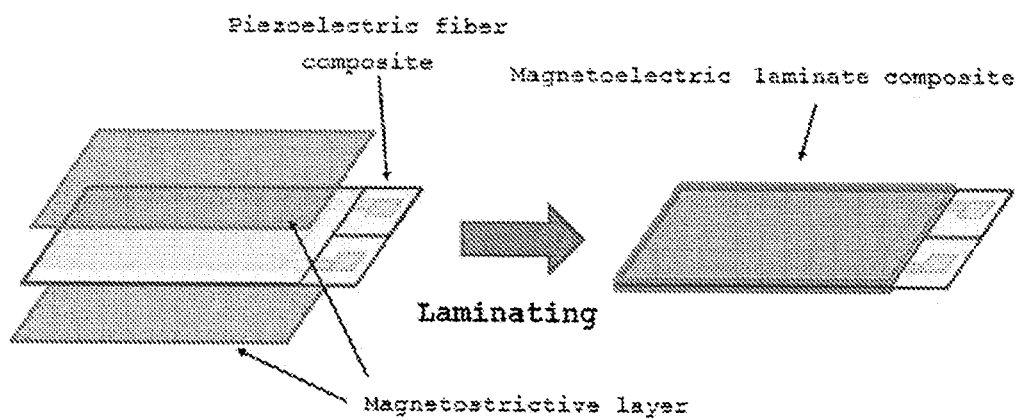
FIG. 3B schematically illustrate a magnetoelectric laminate composite according to another embodiment of the present invention.

As illustrated in FIGS. 3A and 3B, a magnetoelectric laminate composite according to the present invention includes: a piezoelectric fiber composite; and a magnetostrictive layer formed of a magnetostrictive material on one or both sides of the composite, wherein the piezoelectric fiber composite includes piezoelectric fibers composed of a single-crystal piezoelectric material and configured such that the <011> direction of the single crystal is identical to the thickness direction of the composite and the <001> direction of the single crystal is identical to the longitudinal direction of the composite.

In the present invention, the magnetoelectric laminate composite has a structure where two or more different material layers are laminated, thus exhibiting a magnetoelectric (ME) effect.

The magnetoelectric (ME) effect refers to performance able to induce magnetization by the application of an electric field or to induce polarization by a magnetic field. The material that manifests the magnetoelectric effect may include a single phase material such as $Cr_2O_3$, a combination of a piezoelectric material in particulate form and a magnetostrictive material in particulate form, or a composite of a magnetostrictive material and a piezoelectric material stacked so as to form any connectivity as in the present invention. Especially, the composite having a lamination structure is advantageous in terms of high elastic coupling between the piezoelectric layer and the magnetostrictive layer, simple preparation, high electric resistance, easy poling, and high magnetoelectric voltage coefficient ($\alpha_{ME}$), compared to the other kinds of composites.

In the magnetoelectric laminate composite according to the present invention, the configuration having piezoelectric properties is achieved by a piezoelectric fiber composite, and the corresponding piezoelectric fiber composite is preferably a piezoelectric fiber composite in which the single crystal orientation is controlled as mentioned above.

The magnetostrictive material of the magnetostrictive layer may be appropriately selected from among a ferromagnetic metal such as Ni or Fe, ferrite-based ceramics, a magnetostrictive alloy, and a ferromagnetic shape memory alloy (FSMA).

Specific examples of the ferrite-based ceramics may include spinel or magnetoplumbite type ferrite represented by $MFe_2O_4$ or $MFe_{12}O_{19}$ (M is at least one of bivalent meal ions), ferrite represented by $M'_3Fe_5O_{12}$ (M' is a trivalent metal ion), and lithium ferrite represented by $Li_{0.5}Fe_{2.5}O_4$, which are magnetic materials having superior magnetic properties and may thus be selected as the magnetostrictive material of the present invention. More specifically, soft magnetic materials requiring high magnetic permeability, low coercive force and low loss may include soft ferrites such as $Fe_3O_4$, $NiFe_2O_4$, $MnFe_2O_4$, $(Ni,Zn)Fe_2O_4$, $(Mn,Zn)Fe_2O_4$ and $CoFe_2O_4$ suitable for use in magnetic cores of inductors, transformers and filters; magnetic head cores; and magnetic shields. Furthermore, such soft ferrites may be utilized as a magnetostrictive material of the magnetostrictive layer, and are known to be permanent magnet materials and high-density magnetic recording materials. Also, $\gamma$-$Fe_2O_3$ and barium ferrite having high crystal magnetic anisotropy may be contained as the magnetostrictive material in the magnetostrictive layer.

Specific examples of the magnetostrictive alloy may include a terbium-dysprosium-iron alloy (Terfenol-D), a gallium-iron alloy (Gafenol), a samarium-dysprosium-iron alloy (Samfenol-D), a boron-silicon-iron alloy (Metglas 2605SA1), an iron (Fe)-cobalt (Co)-boron (B) alloy, and a boron-silicon-carbon-iron alloy (Metglas 2605SC).

Specific examples of the ferromagnetic shape memory alloy may include NiMnGa, NiMnIn, NiCoMnIn, FePd, FeNiGa and CoNiGa alloys.

Meanwhile, the magnetoelectric laminate composite according to the present invention may further include a proof mass, in addition to the above components, as necessary. Specifically, the magnetoelectric laminate composite may further include a proof mass mounted on at least one of upper and lower sides of one lateral end thereof. When the proof mass having a predetermined weight is mounted in this way, it is possible to control frequency for energy harvesting and to enhance output via an increase in amplitude upon resonance.

In particular, when the magnetoelectric laminate composite according to the present invention is used as an energy harvesting device for power-line monitoring sensor driving power, the parasitic magnetic field of the power-line may vary depending on the countries, but may have a frequency of 50 Hz or 60 Hz. Hence, the resonance/anti-resonance frequency of the energy harvesting magnetoelectric laminate composite for power-line monitoring sensor driving power should be adapted for the frequency of such a parasitic magnetic field. For this, such a frequency may be adjusted via the length of the magnetoelectric laminate composite, or may be adjusted via the size or attachment position of the proof mass in a specific design length.

The material for a proof mass is not particularly limited, but includes a Sm-based permanent magnet, an Nd-based permanent magnet, an AlNiCo-based permanent magnet, or other magnetic materials (iron, nickel, cobalt, magnetic alloys, ceramic ferrite, etc.), making it possible to manufacture an energy harvesting device in more sensitive response to changes in the magnetic field. Particular limitations are not imposed on the method of attaching the proof mass to the magnetoelectric laminate composite.

In addition, the magnetoelectric laminate composite may be manufactured by (a) preparing a magnetostrictive layer composed of a magnetostrictive material; (b) preparing a piezoelectric fiber composite including piezoelectric fibers composed of a single-crystal piezoelectric material and configured such that the <011> direction of the single crystal is identical to the thickness direction of the composite and the <001> direction of the single crystal is identical to the longitudinal direction of the composite; (c) subjecting the piezoelectric fibers to poling; and (d) laminating the magnetostrictive layer on one or both sides of the piezoelectric fiber composite.

In (a), the magnetostrictive layer is prepared using the magnetostrictive material as mentioned above. In this step, the magnetostrictive layer having an appropriate shape in the form of a sheet may be prepared by any method known in the art so as to be adapted for the shape of a final magnetoelectric laminate composite.

In (b), the piezoelectric fiber composite is prepared. This step is preferably implemented by the method of preparing the piezoelectric fiber composite as mentioned above.

In (c), the piezoelectric fibers contained in the piezoelectric fiber composite are subjected to poling to impart the magnetoelectric laminate composite with piezoelectric properties. For example, poling may be conducted in such a manner that voltage higher than the coercive field ($E_c$) of the piezoelectric fibers is applied at room temperature or 100° C. Alternatively, this poling process may be carried out after completion of (d).

In (d), the magnetoelectric laminate composite is formed using the prepared magnetostrictive layer and piezoelectric fiber composite. This step may be completed by laminating the magnetostrictive layer on one or both sides of the piezoelectric fiber composite using any process known in the art. For example, taking into consideration feasibility and profitability of the manufacturing process, the magnetostrictive layer may be bonded on one or both sides of the piezoelectric fiber composite using an adhesive such as epoxy, thus forming the laminate composite.

According to the present invention, the piezoelectric fiber composite and the magnetoelectric laminate composite may exhibit remarkably improved piezoelectric properties and piezoelectric/magnetoelectric properties, and may thus be efficiently utilized in manufacturing piezoelectric devices, such as energy harvesting devices, sensors, actuators, transducers, transformers, sonars, etc.

Figure 5:
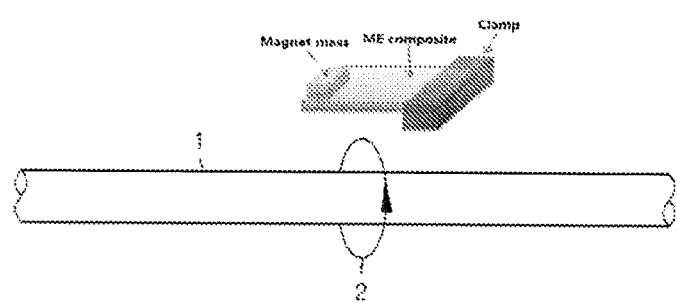
FIG. 5 schematically illustrates the formation of a magnetic field that is the source of power to be supplied to a sensor by the magnetoelectric laminate composite according to the present invention.

For example, when the magnetoelectric laminate composite according to the present invention is used as an energy harvesting device for power-line monitoring sensor driving power, power is supplied to the sensor via energy harvesting for producing power from a parasitic magnetic field around the power-line and/or mechanical vibration energy around the power-line (FIG. 5). Thereby, as power is continuously and stably supplied without the need for periodic replacement of a power supply such as a battery, etc., the sensor node may be operated semi-permanently, and simultaneously the lifecycle of the sensor node and the reliability of data to be sensed may be increased, ultimately accelerating the commercialization of USN-based systems such as power-line remote monitoring systems.

In this regard, the sensor node including the magnetoelectric laminate composite according to the present invention as the energy harvesting device for power-line monitoring sensor driving power is described below.

Figure 6:
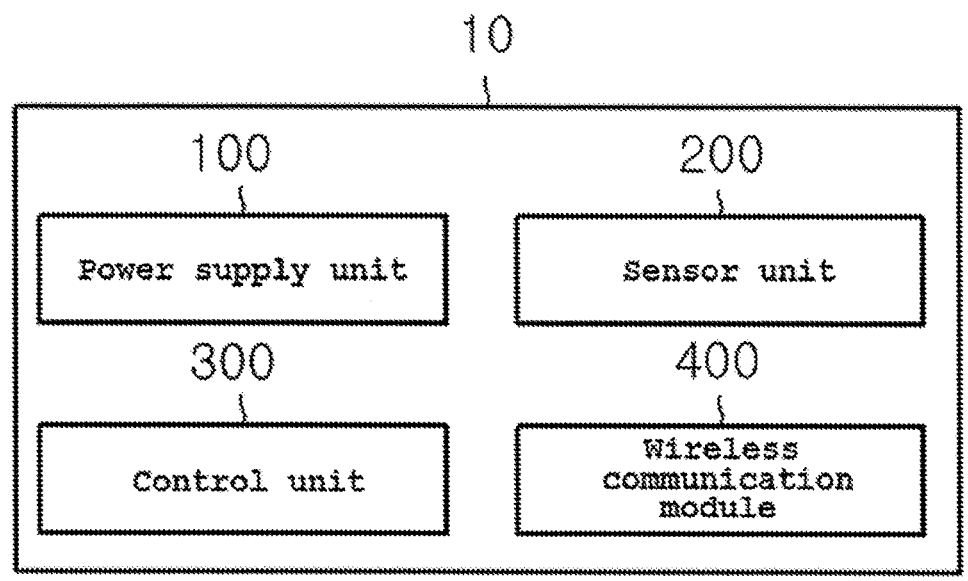
FIG. 6 illustrates a block diagram of a sensor node including an energy harvesting magnetoelectric laminate composite for power-line monitoring sensor driving power according to an embodiment of the present invention.

FIG. 6 illustrates a sensor node according to an embodiment of the present invention. As illustrated in FIG. 6, the sensor node 10 includes a power supply unit 100; a sensor unit 200 for measuring at least one physical data selected from among a temperature, sagging, vibration and current of a power-line; a control unit 300 for processing and transferring the data measured by the sensor unit; and a wireless communication module 400 for wirelessly transmitting the data from the control unit.

Figure 7:
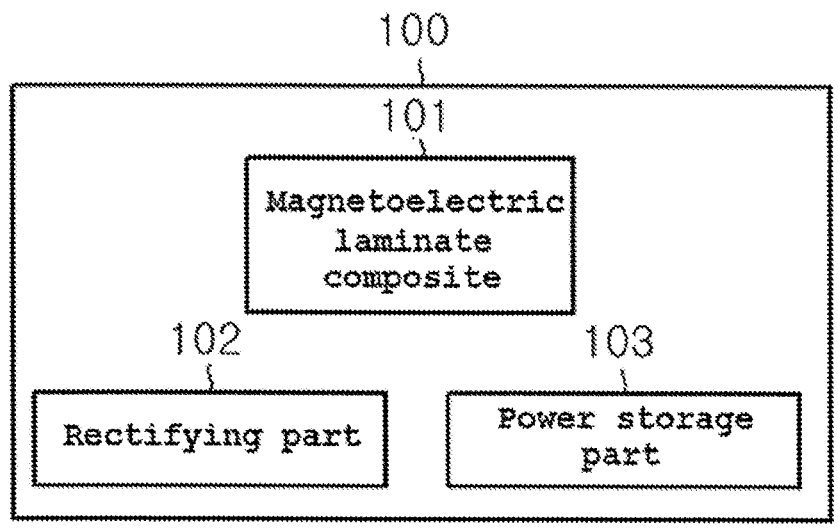
FIG. 7 illustrates a block diagram of a power supply unit of a power-line remote monitoring sensor node according to an embodiment of the present invention.

As illustrated in FIG. 7, the power supply unit 100 may include a magnetoelectric laminate composite 101; a rectifying part 102; and a power storage part 103.

The magnetoelectric laminate composite 101 as above functions as an energy harvesting module for producing AC power from the magnetic field or the mechanical vibration energy around the power-line. As such, the power thus produced is rectified via the rectifying part and then supplied in the form of DC power to the power storage part, thereby semi-permanently operating the sensor node.

The rectifying part 102 is used to convert AC power produced from the magnetoelectric laminate composite into DC power, and may include a bridge type rectifier comprising four diodes. As necessary, a stabilizing circuit may be provided, which includes electronic elements such as a resistor, an inductor and a diode to enhance stability. As such, each element preferably has as high efficiency as possible so as to minimize the loss of the charge amount charged in the power storage part.

The power storage part 103 may be composed of a secondary rechargeable battery or a capacitor so as to enable the charging of power rectified by the rectifying part.

The sensor unit 200 functions to sense physical data such as temperature, sagging, vibration and current, and the control unit 300 functions to convert analog signal type physical data measured by the sensor unit into digital data and to output the converted data together with the position information of the corresponding sensor node so as to transfer them to the wireless communication module.

The wireless communication module 400 functions to transfer the physical data of the power-line received from the control part 300 and the position information data of the sensor node to the adjacent sensor node using a wireless protocol (Bluetooth, IEEE 802.15.4, Zigbee).

Below is a description of a power-line remote monitoring system including the sensor node.

Figure 8:
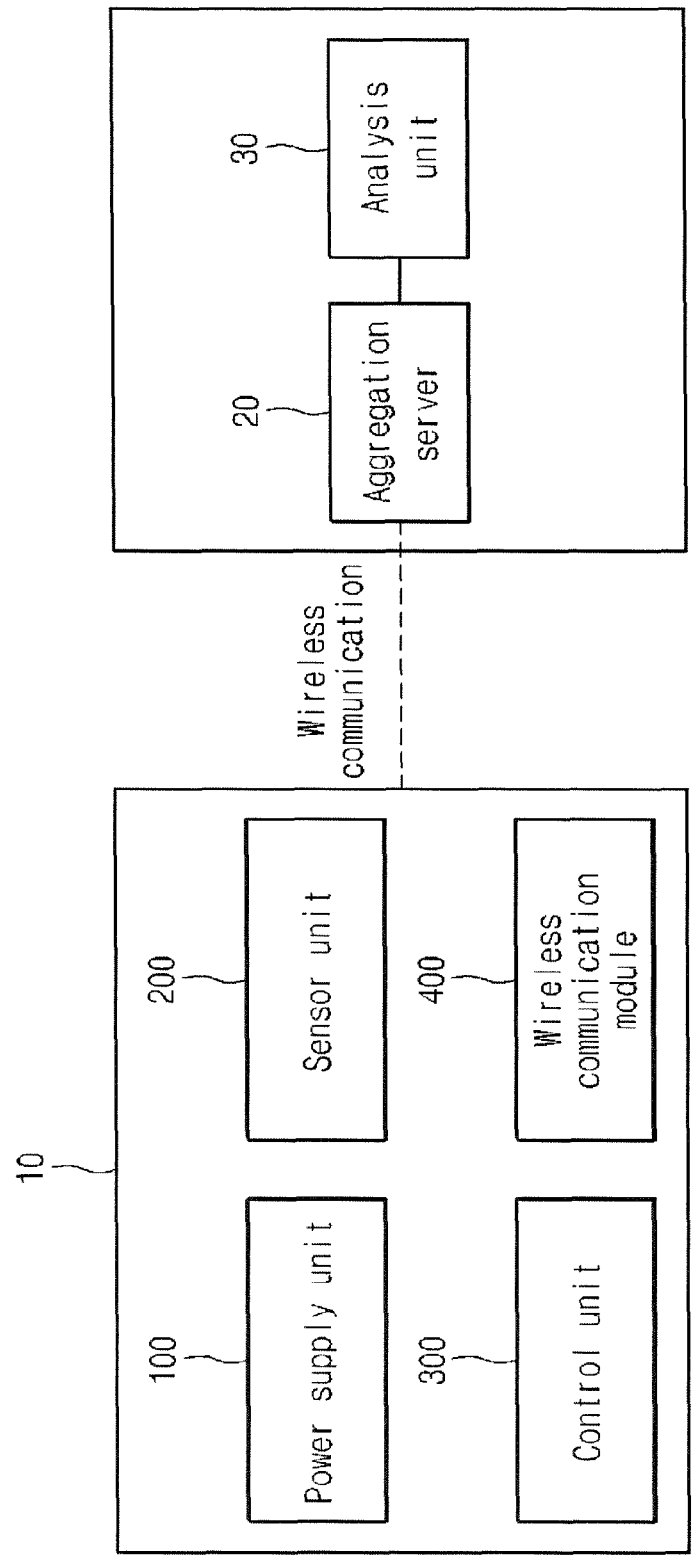
FIG. 8 illustrates a block diagram of a power-line remote monitoring system including the power-line remote monitoring sensor node according to an embodiment of the present invention.

FIG. 8 illustrates a power-line remote monitoring system including the power-line remote monitoring sensor node as mentioned above, according to an embodiment of the present invention. As illustrated in FIG. 8, the power-line remote monitoring system according to the present invention includes the power-line remote monitoring sensor node 10; an aggregation server 20 for receiving and storing the physical data and the position information from the sensor node; and an analysis unit 30 for analyzing a failure position or cause based on the physical data and the position information transferred to the aggregation server.

The aggregation server 20 functions to receive and store the physical data of the power-line and the position information data of the sensor node transferred via wireless communication between adjacent sensor nodes.

The analysis unit 30 plays a role in analyzing the failure position or cause based on the physical data of the power-line and the position information data of the sensor node transferred to the aggregation server 20 via the transmission and storage procedures, thereby rapidly solving problems with the power-line.

A better understanding of the present invention may be obtained via the following examples that are set forth to illustrate, but are not to be construed as limiting the scope of the present invention.

Example 1

A PMN—PZT single-crystal sheet having a rhombohedral perovskite structure where a thickness direction was oriented in [011] and a transverse orientation was $d_{32}$ mode (longitudinal direction: [100], width direction: [0$\bar{1}$1]) was mechanically machined so as to have a thickness of about 200 μm, after which the machined piezoelectric single-crystal sheet was bonded on a PI film having a Cu full-area electrode plated on one side thereof. Subsequently, the piezoelectric single-crystal sheet was cut to a longitudinal direction of the PI film, thus forming a piezoelectric fiber layer including one or more piezoelectric single-crystal fibers with a width of about 200 μm. Subsequently, another PI film having a Cu full-area electrode plated on one side thereof was bonded on the piezoelectric fiber layer using epoxy resin and poling was then performed at an electric field of 1 kV/mm, thereby obtaining a piezoelectric fiber composite.

Thereafter, a Ni plate having a thickness of about 0.25 mm was bonded on one side of the piezoelectric fiber composite using epoxy, ultimately manufacturing a magnetoelectric laminate composite having a structure as illustrated in FIG. 3A.

Example 2

A magnetoelectric laminate composite was manufactured in the same manner as in Example 1, with the exception that a piezoelectric fiber layer was prepared using a PMN—PZT single-crystal sheet having a rhombohedral perovskite structure where a thickness direction was oriented in [011] and a transverse orientation was $d_{31}$ mode (longitudinal direction: [0$\bar{1}$1], width direction: [100]).

Example 3

A magnetoelectric laminate composite having a structure illustrated in FIG. 3B was manufactured in the same manner as in Example 1, with the exception that a Ni plate was bonded on both sides of the piezoelectric fiber composite.

Example 4

A magnetoelectric laminate composite having a structure illustrated in FIG. 3B was manufactured in the same manner as in Example 2, with the exception that a Ni plate was bonded on both sides of the piezoelectric fiber composite.

Example 5

Figure 4:
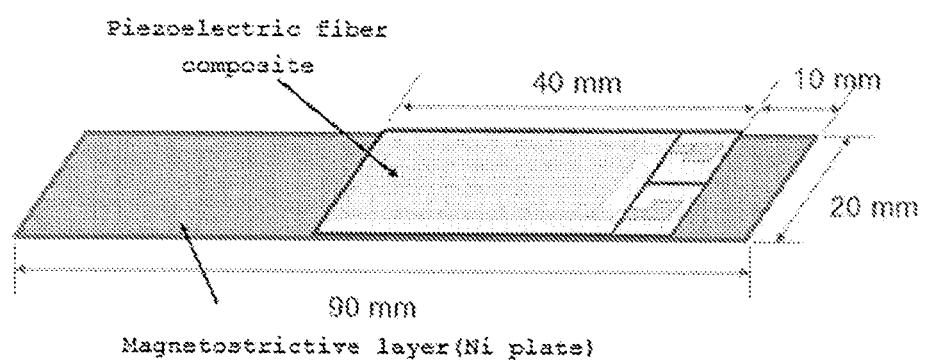
FIG. 4 schematically illustrates a magnetoelectric laminate composite according to still another embodiment of the present invention.

A magnetoelectric laminate composite having a structure illustrated in FIG. 4 was manufactured in the same manner as in Example 1, with the exception that a Ni plate having a size of 90 mm (length)×20 mm (width)×0.25 mm (thickness) was bonded on one side of the piezoelectric fiber composite.

Example 6

A magnetoelectric laminate composite having a structure illustrated in FIG. 4 was manufactured in the same manner as in Example 2, with the exception that a Ni plate having a size of 90 mm (length)×20 mm (width)×0.25 mm (thickness) was bonded on one side of the piezoelectric fiber composite.

Example 7

A magnetoelectric laminate composite was manufactured in the same manner as in Example 1, with the exception that an interdigitated electrode (IDE) made of Cu and having a gap distance of 500 μm was used, instead of the Cu full-area electrode.

Example 8

A magnetoelectric laminate composite was manufactured in the same manner as in Example 2, with the exception that IDE made of Cu and having a gap distance of 500 μm was used, instead of the Cu full-area electrode.

Examples 9 to 12

Respective energy harvesting magnetoelectric laminate composites for power-line monitoring sensor driving power were manufactured by mounting a permanent magnet having a weight of 2 g as a proof mass to one lateral end of each of the magnetoelectric laminate composites of Examples 1, 2, 7, and 8.

Comparative Example 1

A magnetoelectric laminate composite was manufactured in the same manner as in Example 1, with the exception that a piezoelectric fiber layer was prepared using a PMN—PZT single-crystal sheet having a rhombohedral perovskite structure where a thickness direction was oriented in [001].

Comparative Example 2

A magnetoelectric laminate composite was manufactured in the same manner as in Comparative Example 1, with the exception that a Ni plate was bonded on both sides of the piezoelectric fiber composite.

Comparative Example 3

A magnetoelectric laminate composite was manufactured in the same manner as in Example 3, with the exception that a commercially available MFC [Smart Material Corp., USA] was used as the piezoelectric fiber composite.

Comparative Example 4

A magnetoelectric laminate composite having a structure illustrated in FIG. 4 was manufactured in the same manner as in Comparative Example 1, with the exception that a Ni plate having a size of 90 mm (length)×20 mm (width)×0.25 mm (thickness) was bonded on one side of the piezoelectric fiber composite.

Comparative Example 5

An energy harvesting magnetoelectric laminate composite for power-line monitoring sensor driving power was manufactured by mounting a permanent magnet having a weight of 2 g as a proof mass to one lateral end of the magnetoelectric laminate composite of Comparative Example 1.

<Test Example 1> Evaluation of Strain of Piezoelectric Fiber Composite of Example 1 Depending on Application of Electric Field The longitudinal strain and hysteresis of the piezoelectric fiber composite of Example 1 and commercially available MFC [P2 type, Smart Material Corp., USA] depending on the applied electric field were measured. The results are shown in FIG. 9.

Figure 9:
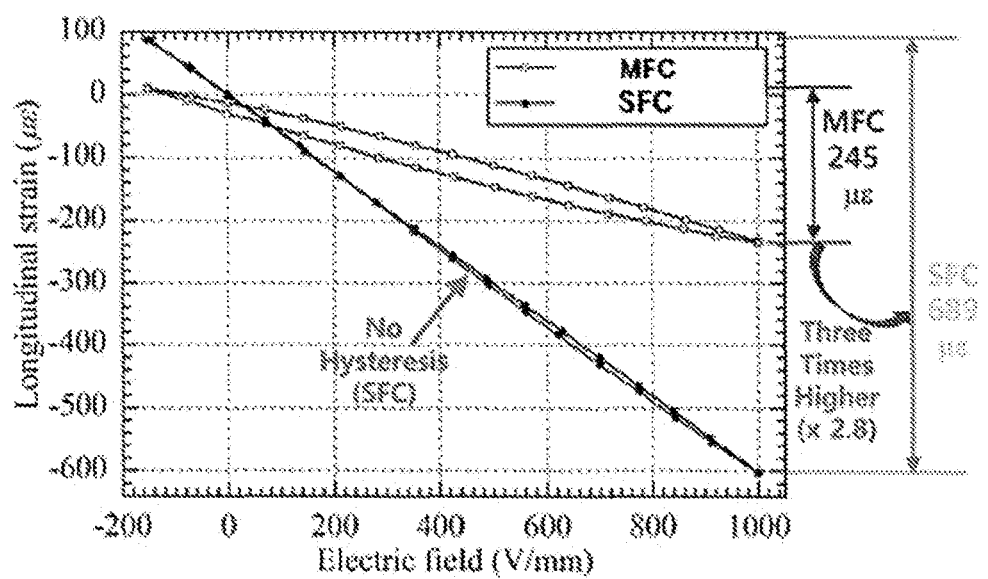
FIG. 9 illustrates the results of measurement of strain depending on the applied electric field in a piezoelectric fiber composite (SFC) of Example 1 and a commercially available MFC.

As shown in FIG. 9, the piezoelectric fiber composite (SFC) of Example 1 manifested strain about three times higher than existing MFC based on the measured strain upon applying an electric field of 1000 V/mm. Furthermore, when the generation of strain hysteresis due to poling depending on changes in the magnitude of the electric field ranging from −150 to 1000 V/mm was observed, strain hysteresis did not actually occur. Hence, the composite of the invention could show remarkably improved performance in actuators and sensors.

<Test Example 2> Evaluation of Magnetoelectric Effect of Magnetoelectric Laminate Composites of Examples 1 to 4 and Comparative Examples 1 to 3

The magnetoelectric laminate composites of Examples 1 to 4 and Comparative Examples 1 to 3 were measured for changes in magnetoelectric voltage coefficient ($\alpha_{ME}$=dE/dH) depending on the magnitude of direct magnetic field ($H_{dc}$).

Figure 10:
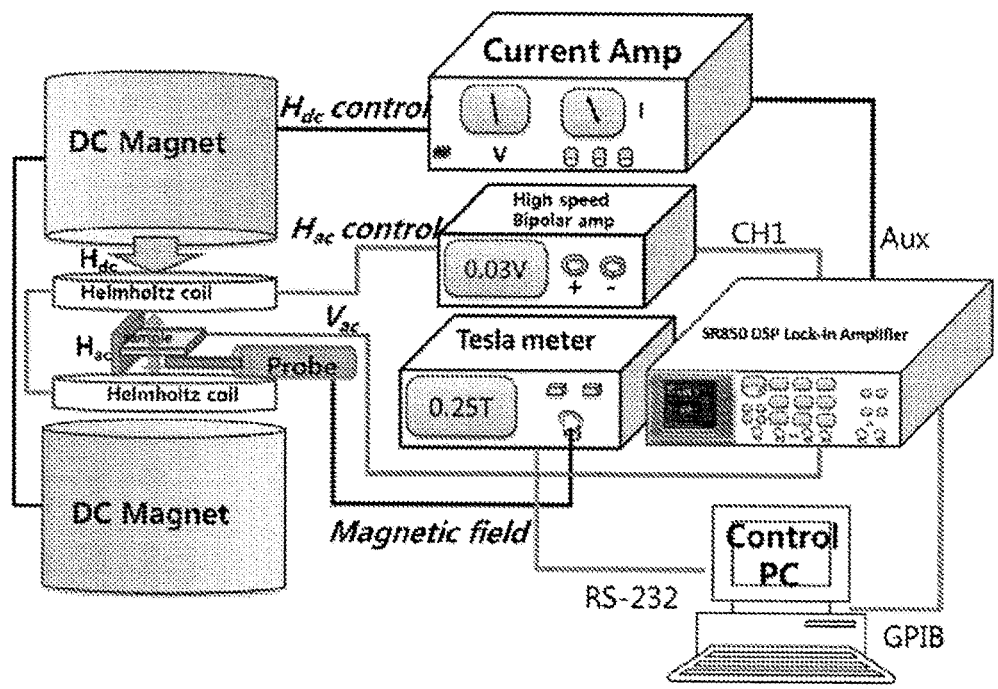
FIG. 10 schematically illustrates a system for measuring the magnetoelectric effect of magnetoelectric laminate composites of Examples 1 to 4, 7 and 8, and Comparative Examples 1 to 3.
Figure 11A:
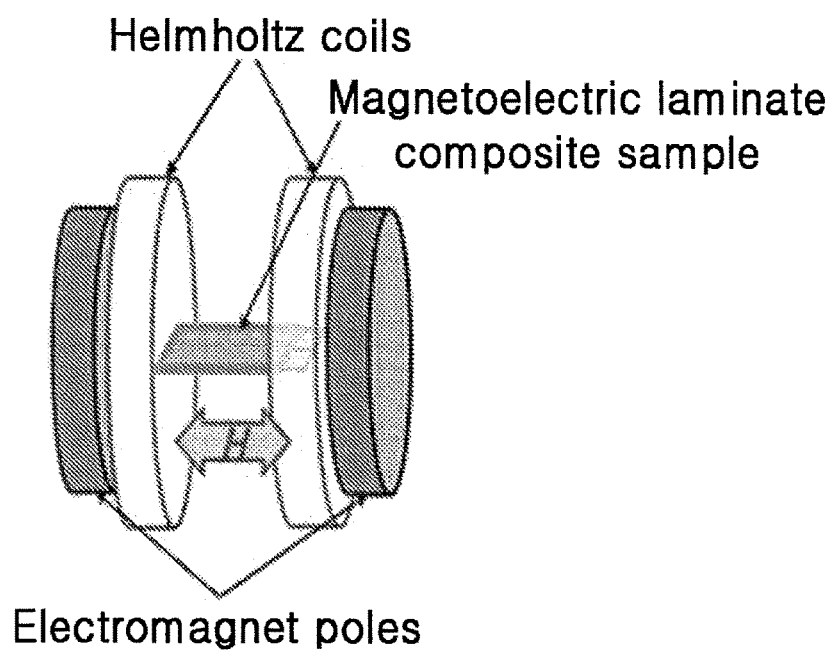
FIGS. 11A and 11B schematically illustrate a relative position relation of a test sample and a magnetic field direction upon measurement of the magnetoelectric effect of the magnetoelectric laminate composites of Examples 1 to 4 and Comparative Examples 1 to 3.
Figure 11B:
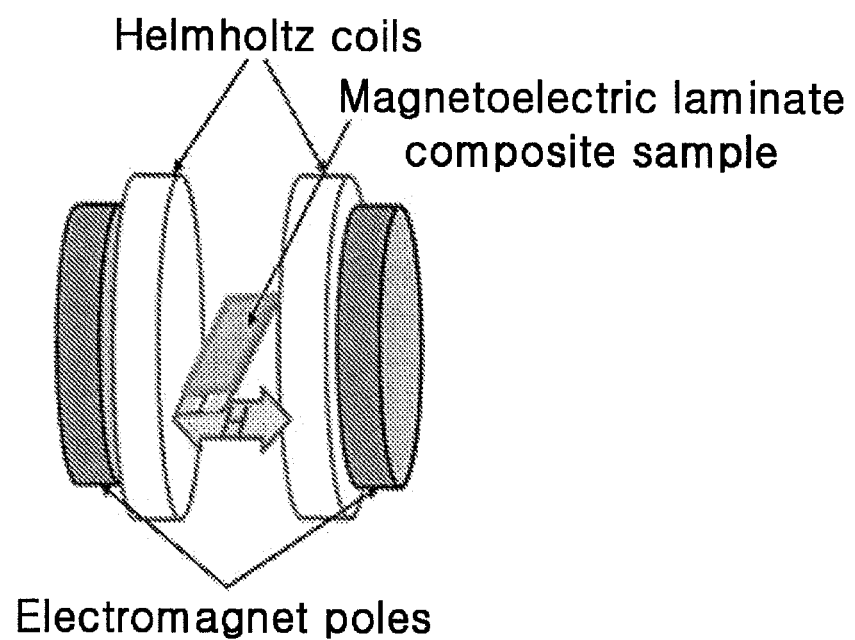

Specifically, as schematically shown in a testing system of FIG. 10, each of the magnetoelectric laminate composites of Examples 1 to 4 and Comparative Examples 1 to 3 was located between Helmholtz coils. As such, the test sample was located in a direction (hereinafter referred to as 'Direction 1') in which the direction of a magnetic field is parallel to the longitudinal direction of a test sample as shown in FIG. 11A, and in a direction (hereinafter referred to as 'Direction 2') in which the direction of a magnetic field is perpendicular to the longitudinal direction of a test sample as shown in FIG. 11B. Furthermore, a frequency of 1 kHz and an alternating magnetic field of 2 Oe were applied using a pair of Helmholtz coils, and the magnitude of a direct magnetic field was differently applied, and thus changes in voltage of the test sample were measured by use of a lock-in amplifier (SR-850, Stanford Research Systems, Inc., Sunnyvale, Calif.), and divided by the thickness (distance between electrodes) of the piezoelectric fibers and the magnitude of alternating magnetic field, thereby obtaining a magnetoelectric voltage coefficient ($\alpha_{ME}$). The results are shown in FIGS. 12 to 14.

Figure 12:
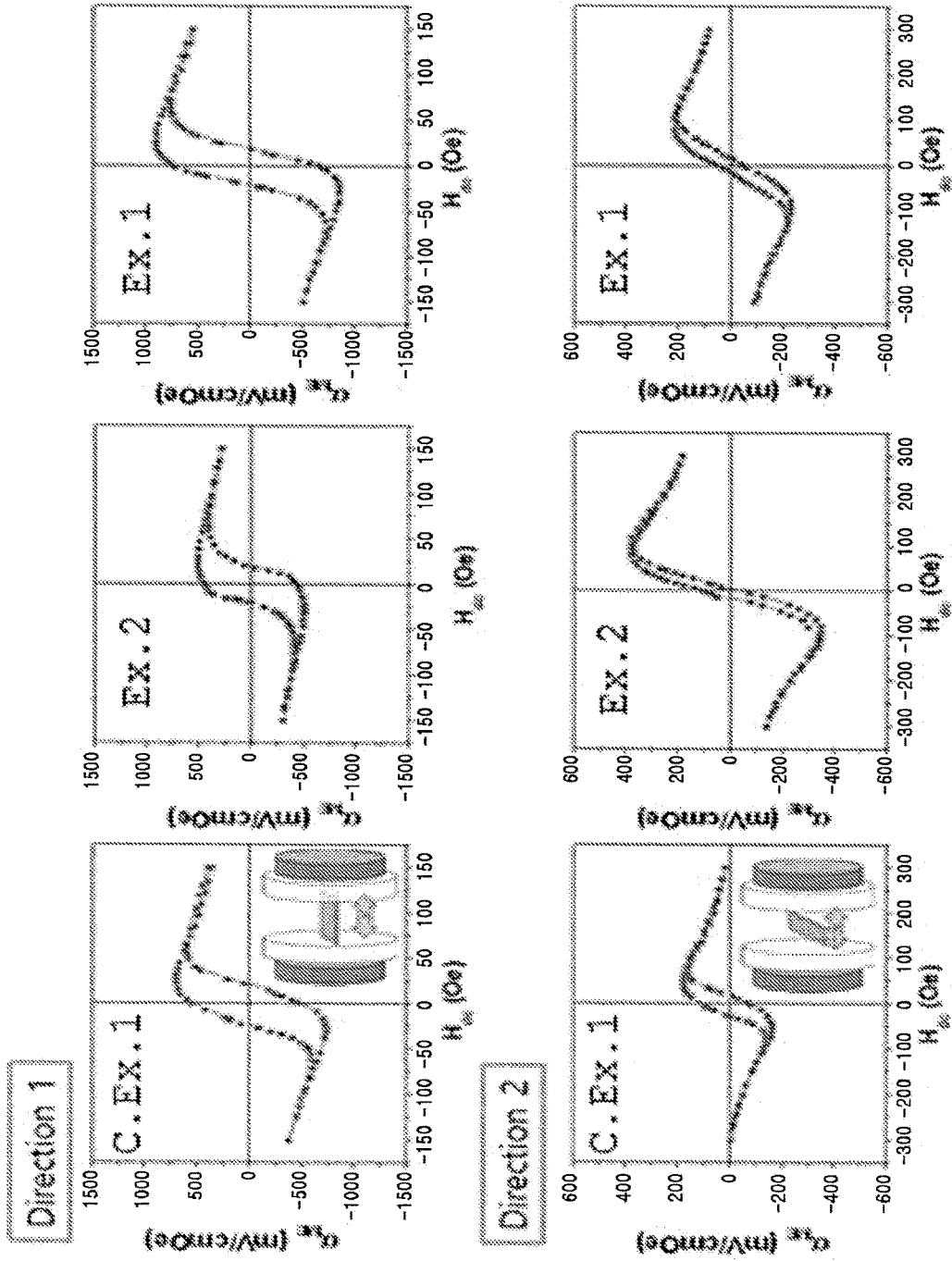
FIG. 12 illustrates the results of measurement of changes in magnetoelectric voltage coefficient ($\alpha_{ME}$) depending on changes in the magnitude of direct magnetic field ($H_{dc}$) in the magnetoelectric laminate composites of Examples 1 and 2 and Comparative Example 1.
Figure 13:
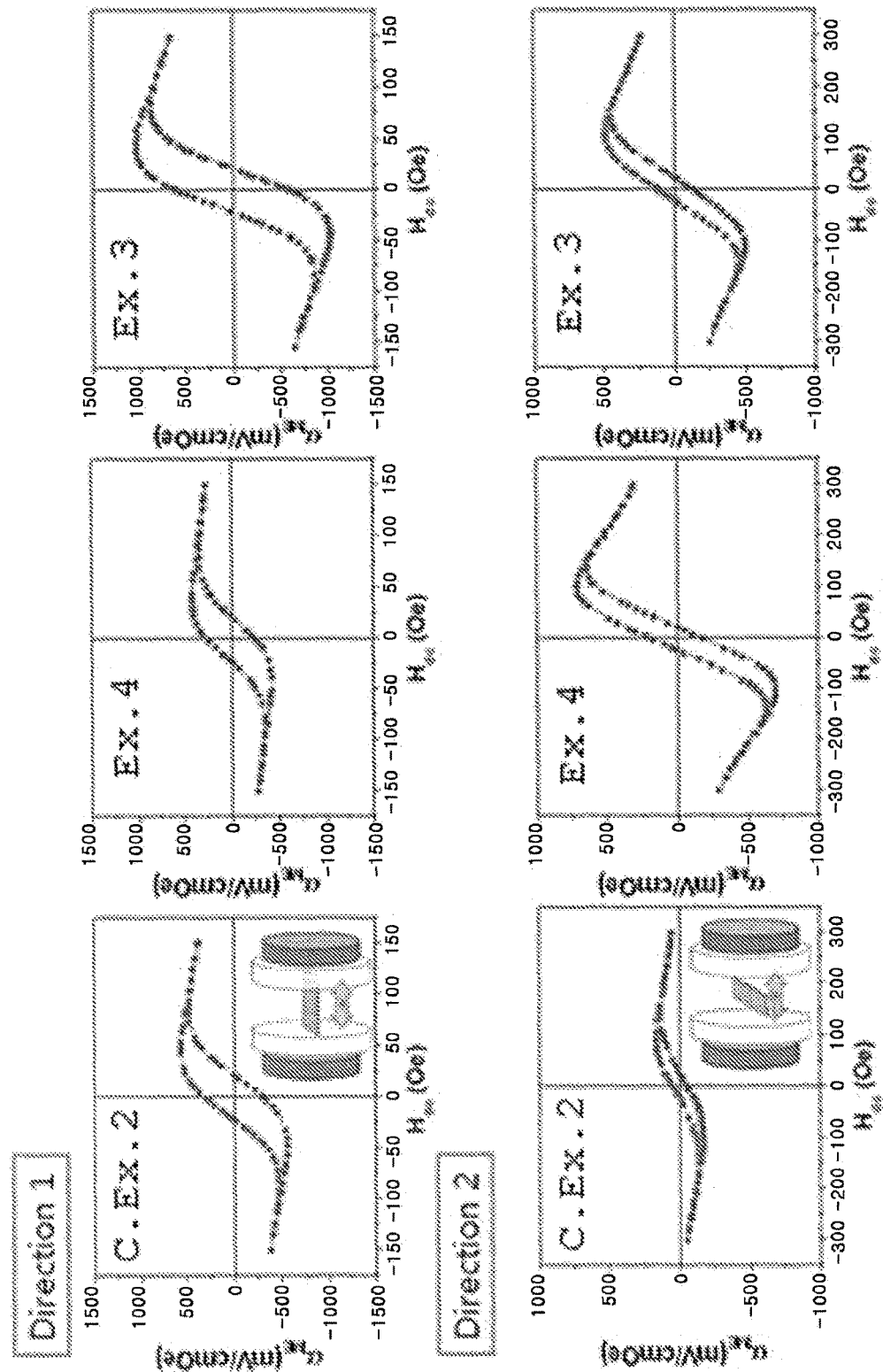
FIG. 13 illustrates the results of measurement of changes in magnetoelectric voltage coefficient ($\alpha_{ME}$) depending on changes in the magnitude of direct magnetic field ($H_{dc}$) in the magnetoelectric laminate composites of Examples 3 and 4 and Comparative Example 2.

As illustrated in FIGS. 12 and 13, the magnitude of $\alpha_{ME}$ is significantly dominated by the crystal orientation of the PMN—PZT piezoelectric single-crystal layer. Specifically, in Examples 1 to 4, when the single crystal having the <011> direction identical to the thickness direction of the composite is used for the composite, relatively high piezoelectric constants $g_{31}$ and $g_{32}$ may be applied, thus exhibiting superior magnetoelectric properties, compared to when using the single crystal having the <001> direction identical to the thickness direction of the composite as in Comparative Example 1 or 2.

Figure 14:
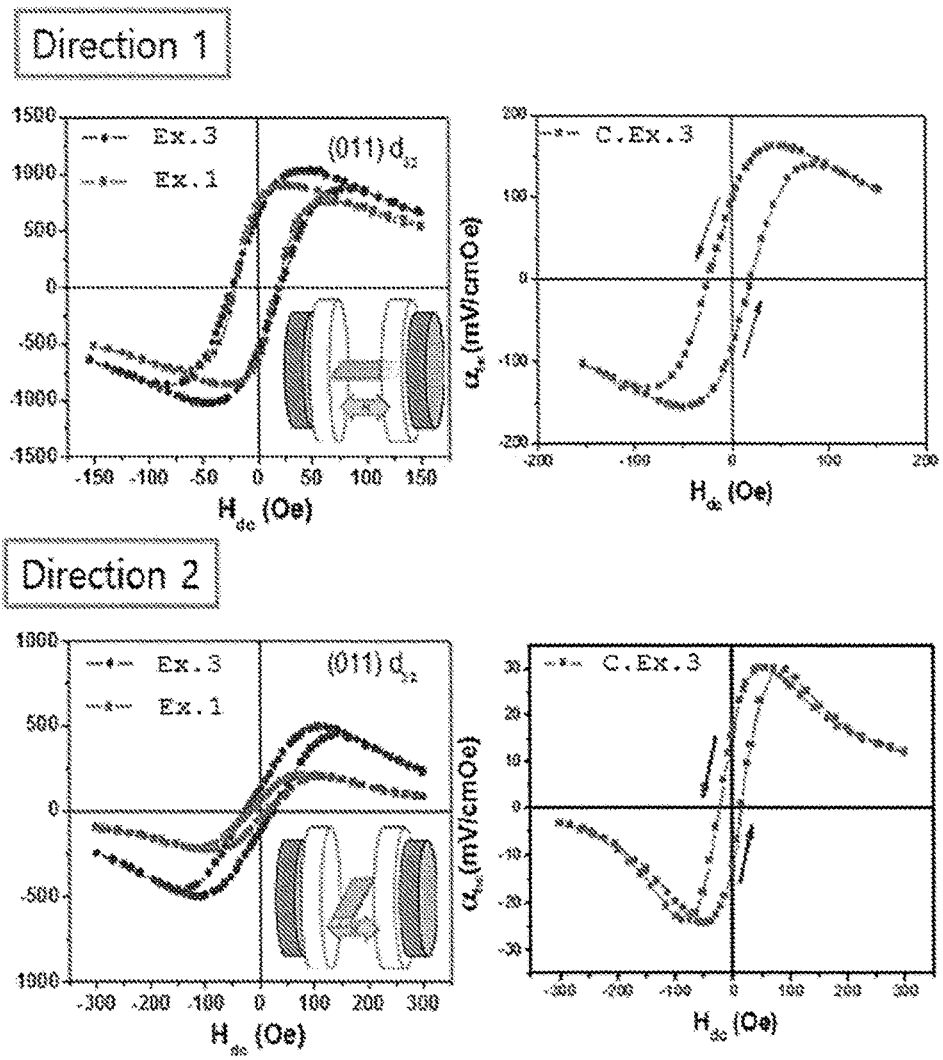
FIG. 14 illustrates the results of measurement of changes in magnetoelectric voltage coefficient ($\alpha_{ME}$) depending on changes in the magnitude of direct magnetic field ($H_{dc}$) in the magnetoelectric laminate composites of Examples 1 and 3 and Comparative Example 3.

As illustrated in FIG. 14, compared to the magnetoelectric laminate composite (Comparative Example 3) using commercially available MFC, the magnetoelectric laminate composites of Examples 1 and 3 exhibited magnetoelectric properties at least 10 times higher than maximum $\alpha_{ME}$. This is because the single-crystal material is used as the piezoelectric fibers in Examples 1 and 3 and also because the single crystal is oriented so that <011> direction thereof is identical to the thickness direction of the composite, thus ensuring large in-plane anisotropy based on transverse piezoelectric properties ($d_{32}$ or $g_{32}$).

<Test Example 3> Evaluation of Magnetoelectric Effects of Magnetoelectric Laminate Composites of Examples 1, 2, 7, and 8 and Comparative Example 1

The magnetoelectric laminate composites of Examples 1, 2, 7, and 8 and Comparative Example 1 were measured for changes in magnetoelectric voltage coefficient ($\alpha_{ME}$=dE/dH) depending on changes in the magnitude of AC magnetic field (Hac).

Specifically, as illustrated in the measurement system of FIG. 10, each of the magnetoelectric laminate composites of Examples 1, 2, 7, and 8 and Comparative Example 1 was positioned between Helmholtz coils. As the sample was differently positioned in a direction where a magnetic field direction is parallel to a longitudinal direction of the sample and a direction where a magnetic field direction is perpendicular to a longitudinal direction of the sample, the magnitude of the AC magnetic field was controlled to be different using a pair of Helmholtz coils, thereby measuring changes in voltage, namely, changes in poling, of the sample using a lock-in amplifier (SR-850, Stanford Research Systems, Inc., Sunnyvale, Calif.). Then, the changes thus measured were divided by changes in the thickness (distance between electrodes) of piezoelectric fibers and the magnitude of AC magnetic field, thus obtaining a magnetoelectric voltage coefficient ($\alpha_{ME}$). The results are shown in FIG. 15.

Figure 15:
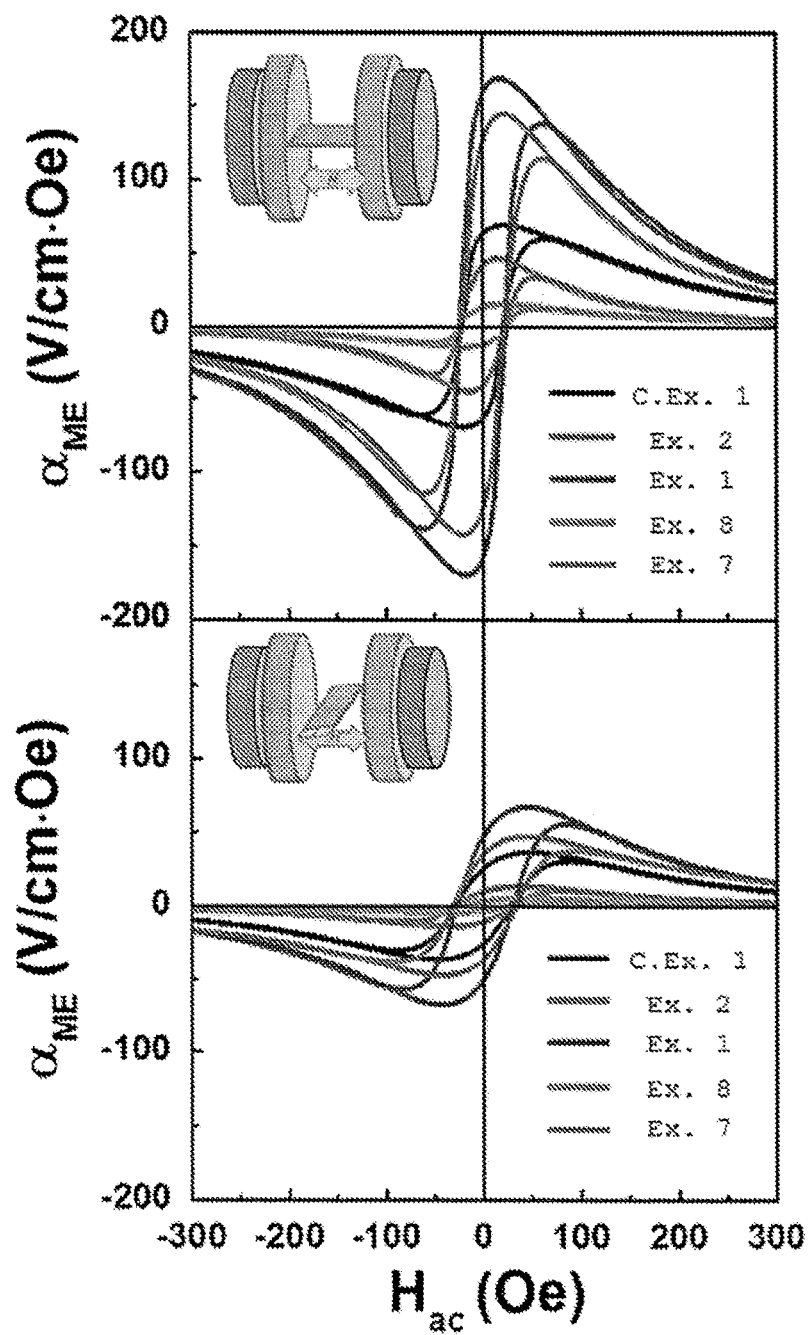
FIG. 15 illustrates the results of measurement of changes in magnetoelectric voltage coefficient ($\alpha_{ME}$) depending on changes in the magnitude of AC magnetic field ($H_{ac}$) for the magnetoelectric laminate composites of Examples 1, 2, 7, and 8 and Comparative Example 1.

As illustrated in FIG. 15, the magnitude of $\alpha_{ME}$ may be dominated by the crystal orientation of PMN—PZT piezoelectric single-crystal layer. In particular, the magnetoelectric laminate composites of Examples 1 to 7 include the single crystal material as piezoelectric fibers, wherein the single crystal is oriented so that <011> direction thereof is identical to the thickness direction of the composite, thus ensuring large in-plane anisotropy based on transverse piezoelectric properties ($d_{32}$ or $g_{32}$). Compared to when using the single crystal oriented so that <001> direction thereof is identical to the thickness direction of the composite as in Comparative Example 1, relatively high piezoelectric constants $g_{31}$ and $g_{32}$ may be utilized, consequently obtaining superior magnetoelectric properties.

<Test Example 4> Evaluation of Magnetoelectricity and Energy Harvesting Properties of Magnetoelectric Laminate Composites of Examples 5 and 6 and Comparative Example 4

Figure 16:
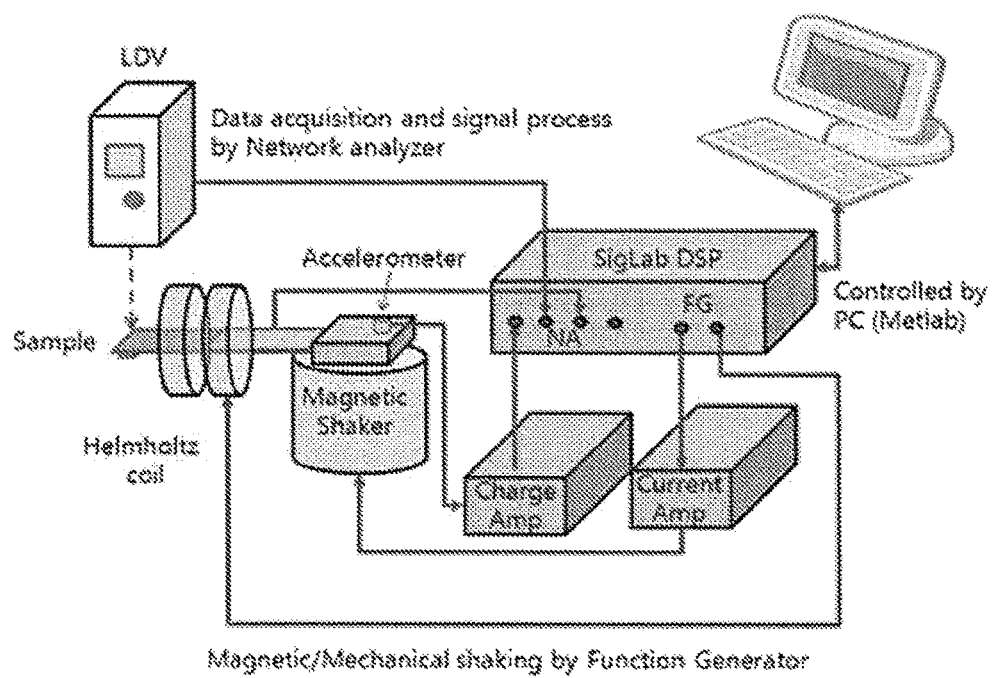
FIG. 16 schematically illustrates a system for measuring energy harvesting properties of the magnetoelectric laminate composites of Examples 5 and 6 and Comparative Example 4.

To evaluate energy harvesting properties of the magnetoelectric laminate composites of Examples 5 and 6 and Comparative Example 4, a testing system was setup as illustrated in FIG. 16. Specifically, a permanent magnet having a weight of 2 g as a proof mass was mounted to one lateral end of each of the magnetoelectric laminate composites of Examples 5 and 6 and Comparative Example 4. Then, mechanical vibration (30 mG, G: gravitational acceleration 9.8 m/sec$^2$) was applied using a magnetic shaker (TJ-22, TMC solution, dynamic), and a magnetic field (1 Oe) was applied using Helmholtz coils, and thereby resonance frequency showing maximum voltage was measured. Additionally, the open circuit voltage ($V_{oc}$) was measured over time at the corresponding resonance frequency. The results are shown in FIGS. 17 and 18A to 18C.

Figure 17:
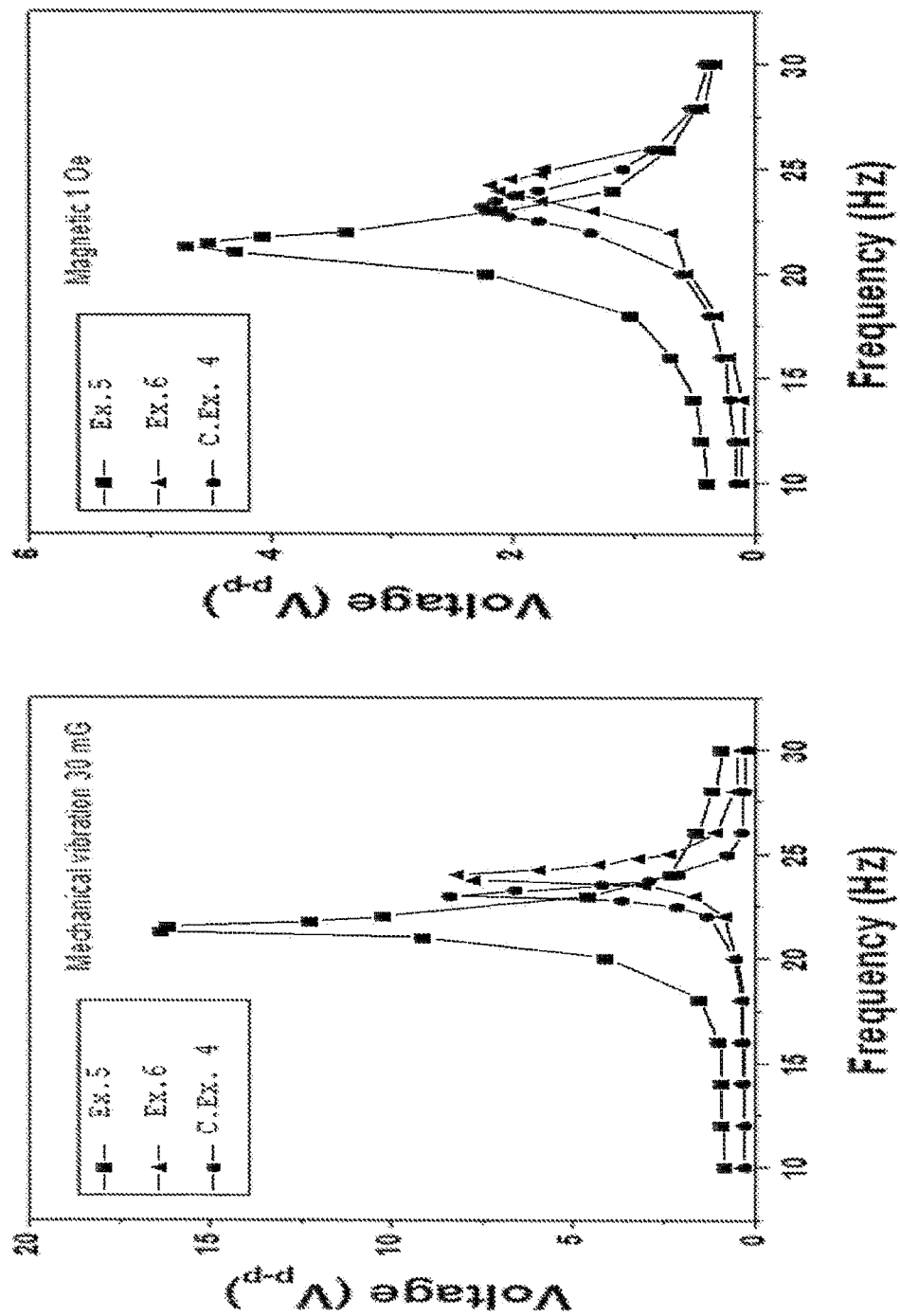
FIG. 17 illustrates the results of measurement of generated voltage depending on changes in the mechanical vibration or magnetic field application frequency in the magnetoelectric laminate composites of Examples 5 and 6 and Comparative Example 4.

As illustrated in FIG. 17, when mechanical vibration or magnetic field was applied to the corresponding test samples, the frequency for maximum voltage upon application of mechanical vibration was the same as that upon application of magnetic field, from which mechanical resonance and magnetic resonance were confirmed to be identical to each other.

Figure 18A:
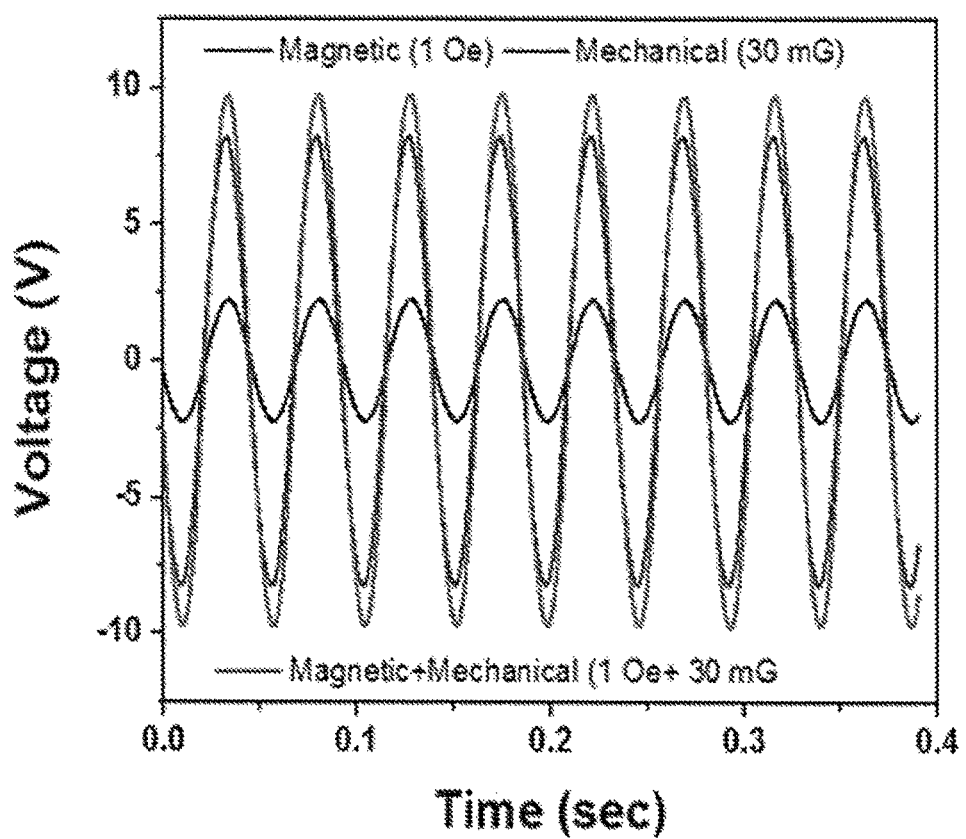
FIGS. 18A to 18C illustrates the results of measurement of open circuit voltage ($V_{oc}$) at frequency showing maximum power voltage upon application of mechanical vibration or magnetic field to the magnetoelectric laminate composites of Examples 5 and 6 and Comparative Example 4.
Figure 18B:
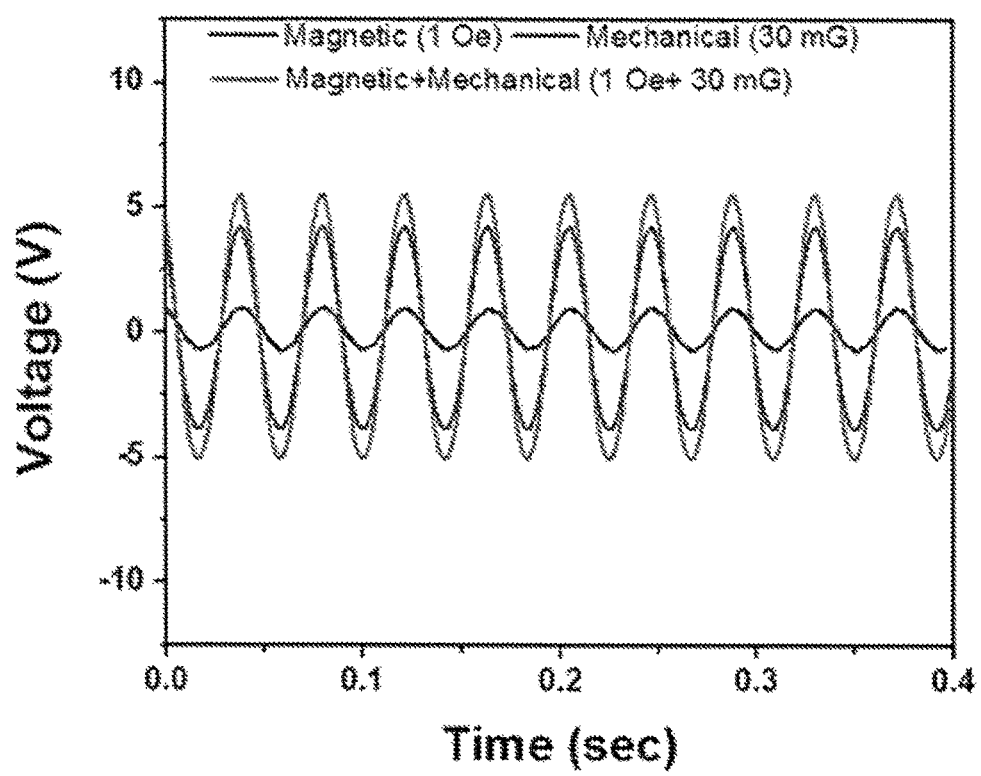
Figure 18C:
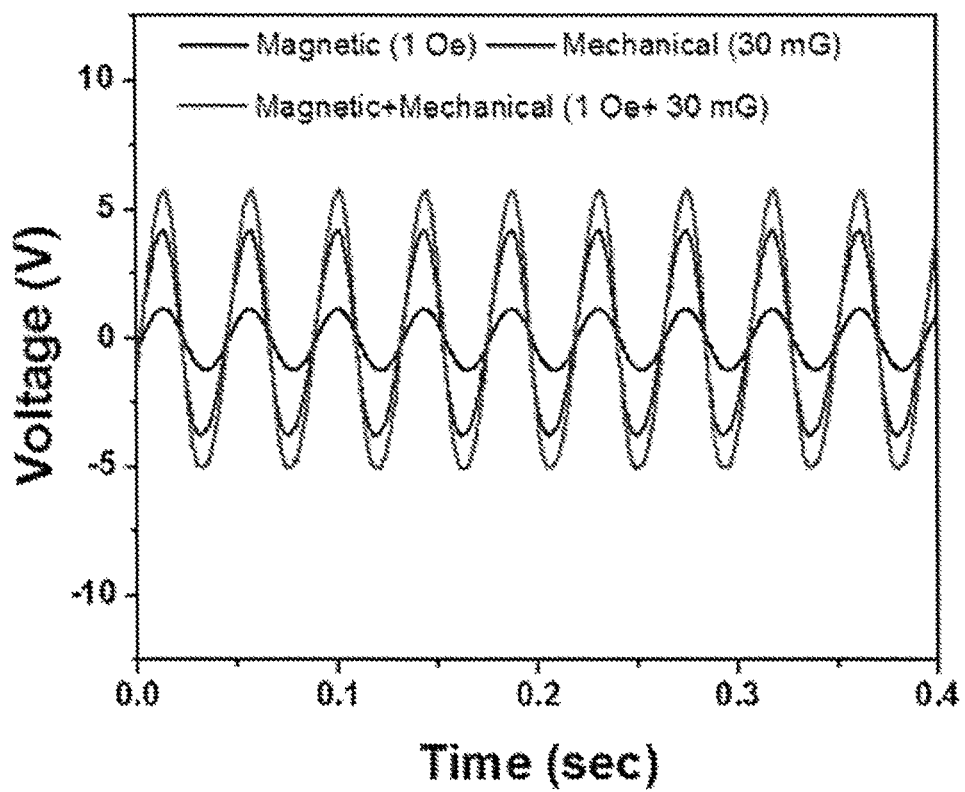

FIGS. 18A to 18C illustrate the results of measurement of open circuit voltage ($V_{oc}$) over time at the resonance frequency at which maximum voltage is generated when applying one or both of mechanical vibration and magnetic field to the test samples of Examples 5 and 6 and Comparative Example 4. As expected, the test sample of Example 5 including the piezoelectric fiber composite made of the PMN—PZT single crystal in which the thickness direction is oriented in [011] and transverse orientation is $d_{32}$ mode (longitudinal direction: [100], width direction: [011]) exhibited the highest peak-to-peak voltage ($V_{p-p}$).

Even at low magnetic field (1 Oe) and mechanical vibration (30 mG), energy harvesting properties corresponding to ones of V were manifested due to magnetic field or mechanical vibration in all of Examples 5 and 6 and Comparative Example 4. When both of vibration and magnetic field were simultaneously applied, two energy harvestings overlapped, thus obtaining superior energy harvesting properties.

Figure 19:
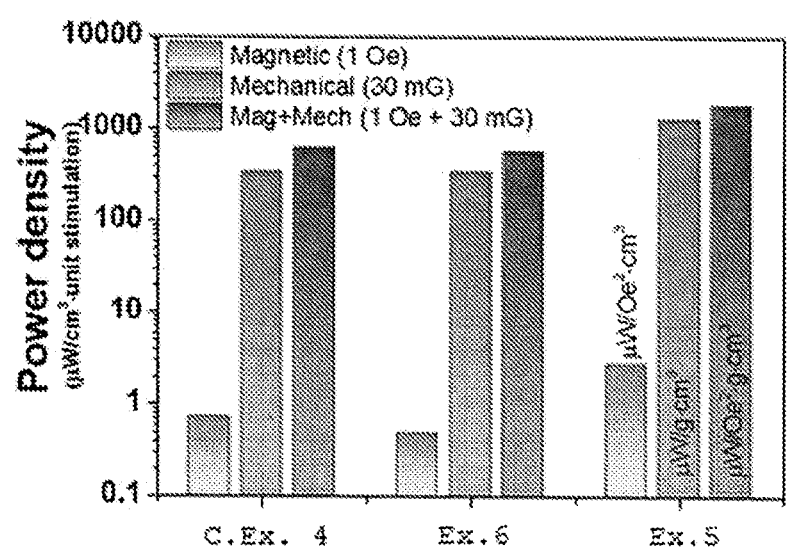
FIG. 19 illustrates the results of measurement of output power density generated upon application of one or both of magnetic field and mechanical vibration to the magnetoelectric laminate composites of Examples 5 and 6 and Comparative Example 4.

Specifically, as illustrated in FIG. 19 showing the results of measurement of output power density generated when applying one or both of magnetic field and mechanical vibration to the magnetoelectric laminate composites of Examples 5 and 6 and Comparative Example 4, the power density generated by magnetic field was measured to be 1 to several $\mu W/Oe^2$ $cm^3$, but the power density generated by vibration stimulation approximated to hundreds of $\mu W/gcm^3$. Briefly, the power density obtained by only the magnetic field stimulation is low to the extent corresponding to a few hundredth of the power density obtained by vibration.

However, when a very weak magnetic field was simultaneously applied in the presence of vibration stimulation, the power density was increased 1.4 to 2 times compared to when only the vibration stimulation was present (in Example 6, the power density was increased from 0.337 $mW/cm^3$ to 0.575 $mW/cm^3$; in Example 5, the power density was increased from 1.274 $mW/cm^3$ to 1.794 $mW/cm^3$; and in Comparative Example 4, the power density was increased from 0.334 $mW/cm^3$ to 0.624 $mW/cm^3$). Briefly, energy harvesting properties were superior when combined stimuli were applied to the magnetoelectric (ME) laminate composite according to the present invention, compared to when single stimulation was applied thereto.

Figure 20:
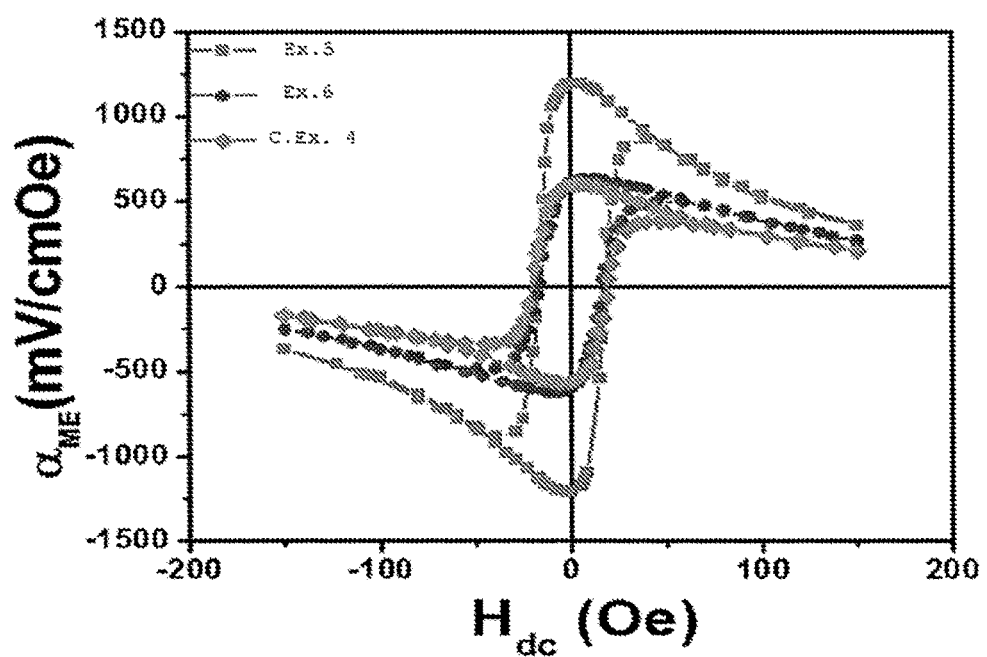
FIG. 20 illustrates the results of measurement of changes in magnetoelectric voltage coefficient ($\alpha_{ME}$) depending on changes in the magnitude of direct magnetic field ($H_{dc}$) in the magnetoelectric laminate composites of Examples 5 and 6 and Comparative Example 4.
Figure 21:
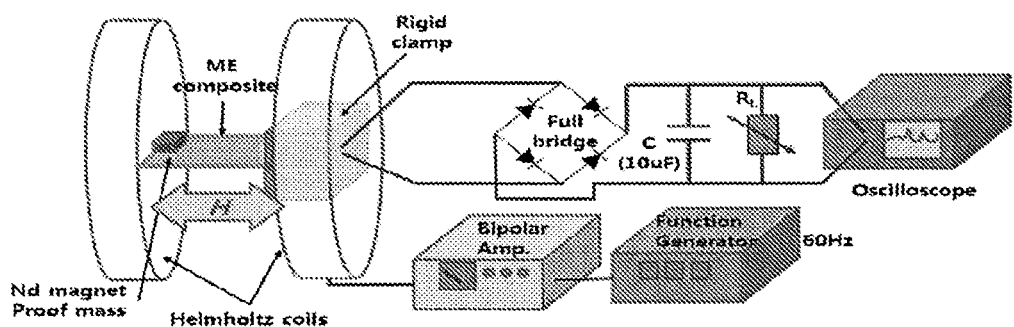
FIG. 21 schematically illustrates a system for measuring the energy harvesting properties of magnetoelectric laminate composites of Examples 9 to 12 and Comparative Example 5.

Meanwhile, FIG. 20 illustrates the results of measurement of changes in magnetoelectric voltage coefficient ($\alpha_{ME}$) depending on changes in the magnitude of direct magnetic field ($H_{dc}$) in the magnetoelectric laminate composites of Examples 5 and 6 and Comparative Example 4. As illustrated in FIG. 21, the test sample of Example 5 exhibits maximum magnetoelectric properties. Furthermore, the test sample of Example 5 includes the magnetostrictive layer (Ni plate) having a larger area than the area of the piezoelectric fiber composite and can thus manifest self-biased magnetoelectricity able to maintain very high ME values even when a direct magnetic field is not applied, which is very advantageous in terms of simply making up the device system without the need to separately apply a direct magnetic field.

<Test Example 5> Evaluation of Energy Harvesting Properties of Magnetoelectric Laminate Composites of Examples 9 to 12 and Comparative Example 5

In order to evaluate the energy harvesting properties in the AC magnetic field of the magnetoelectric laminate composites of Examples 9 to 12 and Comparative Example 5, energy harvesting properties in an AC magnetic field (60 Hz, 1.6 G) generable around power-lines constructed domestically were measured using a setup system as illustrated in FIG. 21.

Figure 22:
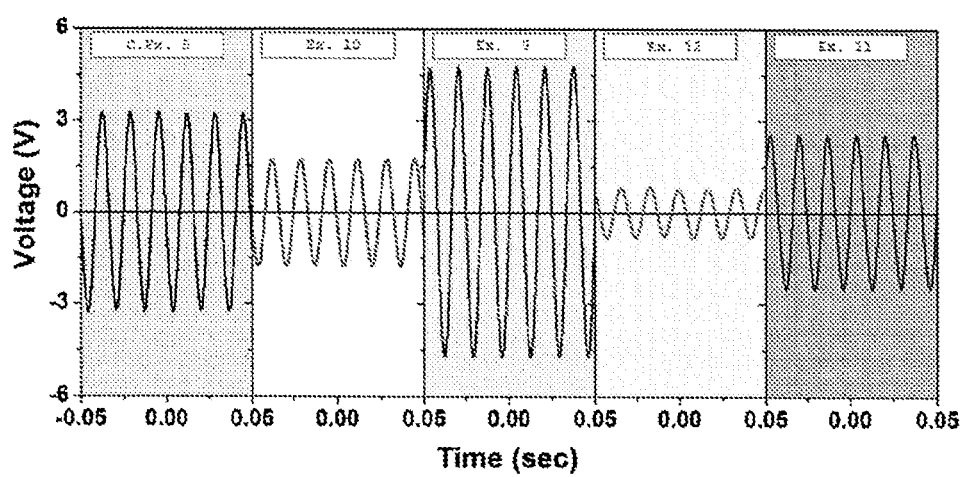
FIG. 22 illustrates AC voltage waveforms generated in an AC magnetic field (60 Hz, 1.6 G) by the magnetoelectric laminate composites of Examples 9 to 12 and Comparative Example 5.

FIG. 22 illustrates the AC voltage waveforms generated in the AC magnetic field by the magnetoelectric laminate composites of Examples 9 to 12 and Comparative Example 5. As estimated from the results of Test Example 3, the magnetoelectric laminate composite of Example 9 exhibited the greatest peak to peak voltage ($V_{p-p}$) as high as about 10 $V_{p-p}$ due to the use of the full-area electrode and the large in-plane anisotropy based on transverse piezoelectric properties ($d_{32}$ or $g_{32}$).

Figure 23:
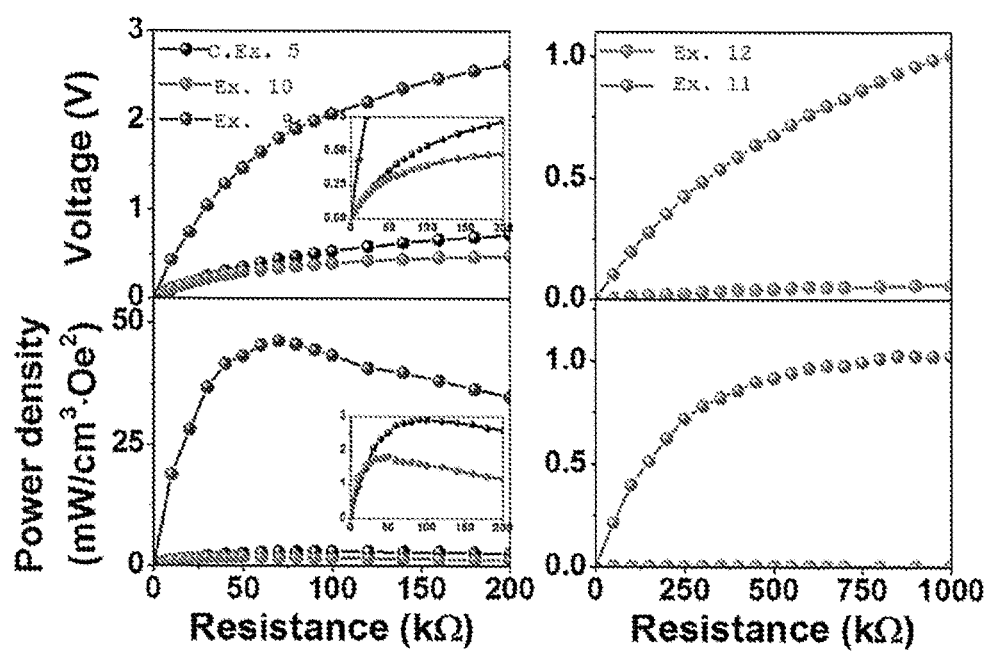
FIG. 23 illustrates the results of measurement of voltage and power density charged in a capacitor after rectifying AC voltage generated in an AC magnetic field (60 Hz, 1.6 G) by the magnetoelectric laminate composites of Examples 9 to 12 and Comparative Example 5, depending on changes in load resistance.

FIG. 23 illustrates the results of measurement of voltage and power density charged in a capacitor after rectifying AC voltage generated in an AC magnetic field by the magnetoelectric laminate composites of Examples 9 to 12 and Comparative Example 5, depending on an increase in the load resistance to 200 KΩ. As illustrated in the measurement results of FIG. 24, the magnetoelectric laminate composite of Example 9 manifested the highest voltage and power density (increased by 1600% compared to Comparative Example 5) by the use of the full-area electrode and the large in-plane anisotropy for transverse piezoelectric properties ($d_{32}$ or $g_{32}$).

Figure 24:
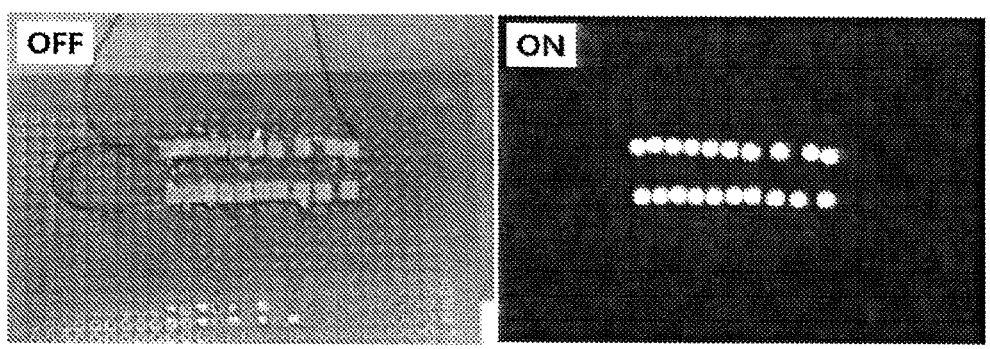
FIG. 24 illustrates the results of testing the lighting of a commercially available high-luminance LED using DC power charged in a capacitor after rectifying AC power generated by the magnetoelectric laminate composite of Example 9.

FIG. 24 illustrates the results of testing the lighting of a commercially available high-intensity LED using DC power charged in a capacitor after rectifying AC power generated by the magnetoelectric laminate composite of Example 9. Therefore, when the magnetoelectric laminate composite according to the present invention is used as an energy harvesting device, power necessary for driving the sensor of a USN-based power-line remote monitoring system may be sufficiently supplied.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A piezoelectric fiber composite, comprising:
   a first protective layer including a first electrode formed on one side thereof;
   a second protective layer including a second electrode formed on one side thereof; and
   a piezoelectric fiber layer interposed between the first electrode and the second electrode and composed of one or more piezoelectric fibers arranged in a longitudinal direction of the composite,
   wherein,
   the piezoelectric fibers comprise a single-crystal piezoelectric material and are configured such that a <011> direction of a single crystal is identical to a thickness direction of the composite and a <001> direction of the single crystal is identical to a longitudinal direction of the composite.

2. The piezoelectric fiber composite of claim 1, wherein the single-crystal piezoelectric material has a perovskite crystal structure or a complex perovskite crystal structure.

3. The piezoelectric fiber composite of claim 2, wherein the single-crystal piezoelectric material having the complex perovskite crystal structure is represented by Chemical Formula 1) or 2) below:

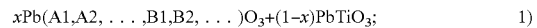

$$xPb(A1,A2,\ldots,B1,B2,\ldots)O_3+(1-x)PbTiO_3; \quad 1)$$

and

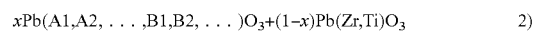

$$xPb(A1,A2,\ldots,B1,B2,\ldots)O_3+(1-x)Pb(Zr,Ti)O_3 \quad 2)$$

Wherein,
   x is a molar fraction, 0<x<1, each of A1 and A2 represent at least one element selected from the group consisting of Zn, Mg, Ni, Lu, In and Sc, and each of B1 and B2 represent at least one element selected from the group consisting of Nb, Ta, Mo and W.

4. The piezoelectric fiber composite of claim 2, wherein the single-crystal piezoelectric material having the complex perovskite crystal structure has a rhombohedral crystal structure.

5. The piezoelectric fiber composite of claim 1, wherein the first electrode and the second electrode are a full-area electrode.

6. The piezoelectric fiber composite of claim 1, wherein the first electrode and the second electrode are an interdigitated electrode (IDE).

7. The piezoelectric fiber composite of claim 1, wherein the first protective layer and the second protective layer comprise polyimide (PI), polyethylene naphthalate (PEN), polyethylene terephthalate (PET) or polycarbonate (PC).

8. A magnetoelectric laminate composite, comprising:
a piezoelectric fiber composite; and
a magnetostrictive layer formed of a magnetostrictive material on one or both sides of the composite,
wherein,
the piezoelectric fiber composite includes piezoelectric fibers composed of a single-crystal piezoelectric material and configured such that a <011> direction of a single crystal is identical to a thickness direction of the composite and a <001> direction of the single crystal is identical to a longitudinal direction of the composite.

9. The magnetoelectric laminate composite of claim 8, wherein the single-crystal piezoelectric material has a perovskite crystal structure or a complex perovskite crystal structure.

10. The magnetoelectric laminate composite of claim 8, further comprising a proof mass composed of a permanent magnet on at least one of upper and lower sides of one lateral end of the magnetoelectric laminate composite.

11. The magnetoelectric laminate composite of claim 9, wherein the single-crystal piezoelectric material having the complex perovskite crystal structure is represented by Chemical Formula 1) or 2) below:

$$x\text{Pb}(A1,A2,\ldots,B1,B2,\ldots)O_3+(1-x)\text{PbTiO}_3; \quad 1)$$

and $$x\text{Pb}(A1,A2,\ldots,B1,B2,\ldots)O_3+(1-x)\text{Pb}(Zr,Ti)O_3 \quad 2)$$

Wherein,
x is a molar fraction, $0<x<1$,
each of A1 and A2 represent at least one element selected from the group consisting of Zn, Mg, Ni, Lu, In and Sc, and
each of B1 and B2 represent at least one element selected from the group consisting of Nb, Ta, Mo and W.

12. The magnetoelectric laminate composite of claim 9, wherein the single-crystal piezoelectric material having the complex perovskite crystal structure has a rhombohedral crystal structure.

13. The magnetoelectric laminate composite of claim 8, wherein the magnetostrictive material is a ferromagnetic metal, ferrite-based ceramics, a magnetostrictive alloy or a magnetic shape memory alloy.

* * * * *